(12) United States Patent
Wu et al.

(10) Patent No.: US 11,079,869 B2
(45) Date of Patent: Aug. 3, 2021

(54) METHOD FOR DETERMINING TOUCH LAYER PATTERN, TOUCH DISPLAY DEVICE, COMPUTER DEVICE AND STORAGE MEDIUM

(71) Applicants: BOE Technology Group Co., Ltd., Beijing (CN); Chongqing BOE Optoelectronics Technology Co., Ltd., Chongqing (CN)

(72) Inventors: Junhui Wu, Beijing (CN); Xin Bi, Beijing (CN); Xun Pu, Beijing (CN); Jiandong Guo, Beijing (CN); Zhongshan Wu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 93 days.

(21) Appl. No.: 16/136,405

(22) Filed: Sep. 20, 2018

(65) Prior Publication Data
US 2019/0302938 A1    Oct. 3, 2019

(30) Foreign Application Priority Data

Apr. 3, 2018    (CN) .......................... 201810292162.5

(51) Int. Cl.
*G06F 3/041*    (2006.01)
*G06F 3/044*    (2006.01)
*G06F 30/39*    (2020.01)

(52) U.S. Cl.
CPC ............ *G06F 3/0412* (2013.01); *G06F 3/044* (2013.01); *G06F 30/39* (2020.01); *G06F 2203/04103* (2013.01)

(58) Field of Classification Search
None
See application file for complete search history.

(56) References Cited

U.S. PATENT DOCUMENTS

2014/0240246 A1* 8/2014 Kim ...................... G06F 3/0412
                                                                  345/173
2017/0221196 A1* 8/2017 Yamaguchi ........... G06F 3/0445
(Continued)

FOREIGN PATENT DOCUMENTS

CN    104020873 A    9/2014
CN    106990868 A    7/2017
(Continued)

OTHER PUBLICATIONS

First office action of Chinese application No. 201810292162.5 dated Sep. 16, 2020.

*Primary Examiner* — Andre L Matthews
(74) *Attorney, Agent, or Firm* — Fay Sharpe LLP

(57) ABSTRACT

A method for determining a touch layer pattern, a touch display device, a computer device and a storage medium are provided. The method includes: providing a pixel pattern which contains a light shielding region and a sub-pixel region defined by the light shielding region; superimposing at least two different touch patterns with the pixel pattern respectively to obtain at least two superimposed patterns; and determining, as a touch layer pattern, a touch pattern from the at least two touch patterns, according to equivalent grayscales of the at least two superimposed patterns.

16 Claims, 17 Drawing Sheets

(56) References Cited

U.S. PATENT DOCUMENTS

| | | | |
|---|---|---|---|
| 2018/0004341 A1* | 1/2018 | Yeh | .................. G02F 1/134309 |
| 2019/0095020 A1 | 3/2019 | Wu et al. | |
| 2020/0033999 A1 | 1/2020 | Xie et al. | |

FOREIGN PATENT DOCUMENTS

| | | | |
|---|---|---|---|
| CN | 107193442 A | 9/2017 | |
| CN | 107515697 A | 12/2017 | |
| CN | 107562249 A | 1/2018 | |
| CN | 107678588 A | 2/2018 | |

* cited by examiner

METHOD FOR DETERMINING TOUCH LAYER PATTERN, TOUCH DISPLAY DEVICE, COMPUTER DEVICE AND STORAGE MEDIUM

This application claims priority to the Chinese Patent Application No. 201810292162.5, filed on Apr. 3, 2018 and titled "METHOD FOR DETERMINING TOUCH LAYER PATTERN, TOUCH DISPLAY DEVICE, COMPUTER DEVICE AND STORAGE MEDIUM", the disclosure of which is incorporated herein by reference in its entirety.

TECHNICAL FIELD

The present disclosure relates to a method for determining a touch layer pattern, a touch display device, a computer device and a storage medium.

BACKGROUND

Touch display devices are widely used in the display field. Usual touch display devices include smart phones, tablet computers, smart vehicle-mounted terminals, etc.

An existing touch display device comprises a backlight source and a display panel. The display panel comprises an array substrate and a color film substrate which are arranged in a box-alignment manner, and a liquid crystal layer disposed between the array substrate and the color film substrate. The color film substrate comprises a base substrate, a color filter film formed on one side of the base substrate, and a touch layer arranged on the other side of the base substrate. When the touch display device is in use, a light emitted from the backlight source sequentially passes through the array substrate, the liquid crystal layer, the color film substrate and the touch layer, and then exits.

When the light passes through the color film substrate and the touch layer, interference will occur which causes that a moire pattern visible to the human eyes is likely to appear on a displayed image, thereby affecting the display effect.

SUMMARY

Embodiments of the present disclosure provide a method for determining a touch layer pattern, a touch display device, a computer device and a storage medium.

At least one embodiment of the present disclosure provides a method for determining a touch layer pattern, comprising the following steps:

providing a pixel pattern including a light shielding region and a sub-pixel region defined by the light shielding region;

superimposing at least two different touch patterns with the pixel pattern respectively to obtain at least two superimposed patterns; and determining a touch pattern as a touch layer pattern from the at least two touch patterns according to equivalent grayscales of the at least two superimposed patterns.

Optionally, said determining a touch pattern as a touch layer pattern from the at least two touch patterns according to the equivalent grayscales of the at least two superimposed patterns comprises:

dividing the superimposed pattern into a plurality of first regions;

calculating an equivalent grayscale value of each of the first regions;

calculating a variance according to the equivalent grayscale value of each of the first regions; and selecting a touch pattern as the touch layer pattern from the touch patterns whose variances are less than a set value.

Optionally, said selecting a touch pattern as the touch layer pattern from the touch patterns whose variances are less than a set value comprises:

selecting a touch pattern with the smallest variance as the touch layer pattern from the touch patterns whose variances are less than the set value.

Optionally, each of the first regions comprises a first lower layer region located on the pixel pattern and a first upper layer projection region located on the touch pattern; said calculating an equivalent grayscale value of each of the first regions comprises:

setting the equivalent grayscale value of the first region as 0 when the first lower layer region of the first region is located in the light shielding region; and calculating the equivalent grayscale value of the first region according to the following formula when the first lower layer region of the first region is located in the sub-pixel region, $N=255*K_2$, where $K_2$ is a light transmittance of the touch pattern in the first upper layer projection region of the first region, and $0<K_2\leq 1$.

Optionally, said calculating an equivalent grayscale value of each of the first regions comprises:

dividing each of the first regions into a plurality of second regions;

calculating an equivalent grayscale value of each of the second regions; and taking an average value of the equivalent grayscale values of all of the second regions in each of the first regions as an equivalent grayscale value of the first region.

Optionally, each of the second regions comprises a second lower layer region located on the pixel pattern and a second upper layer projection region located on the touch pattern, and an orthographic projection, on the touch pattern, of the second lower layer region coincides with the second upper layer projection region.

Optionally, each of the second regions comprises a second lower layer region located on the pixel pattern and a second upper layer projection region located on the touch pattern; said dividing each of the first regions into a plurality of second regions comprises:

designating a reference point on the touch pattern, and designating an observation point on a straight line perpendicular to the touch pattern with the reference point as a perpendicular foot, the touch pattern being located between the observation point and the pixel pattern;

dividing the pixel pattern into a plurality of second lower layer regions; and taking a region surrounded by oblique projection points of the edge points, on the touch pattern, of the second lower layer region as the corresponding second upper layer projection region, wherein the edge point, the oblique projection point of the edge point on the touch pattern and the observation point satisfying the following relationship:

a light emitted from a point light source disposed at the edge point and passing through the oblique projection point, on the touch pattern, of the edge point can pass through the observation point after passing through the touch pattern.

Optionally, a distance L between the edge point and the reference point, and a distance x between the oblique projection point, on the touch pattern, of the edge point and the reference point satisfy the following equation:

$$L = \frac{d \cdot x}{\sqrt{(n^2-1)x^2 + n^2(h-d)^2}} + x,$$

where d is a thickness of a color film substrate, n is a refractive index of the color film substrate, h is a distance between the observation point and the pixel pattern, and h>d.

Optionally, said calculating the equivalent grayscale value of each of the second regions comprises:

setting the equivalent grayscale value of the second region as 0 when the second lower layer region of the second region is located in the light shielding region; and calculating the equivalent grayscale value of the second region according to the following formula when the second lower layer region of the second region is located in the sub-pixel region, N=255*$K_3$, where, $K_3$ is a light transmittance of the touch pattern in the second upper layer projection region, and 0<$K_3$≤1.

At least one embodiment of the present disclosure provides a touch display device, comprising a touch layer of which a touch layer pattern is determined by using the method for determining a touch layer pattern, comprising:

providing a pixel pattern including a light shielding region and a sub-pixel region defined by the light shielding region;

superimposing at least two different touch patterns with the pixel pattern respectively to obtain at least two superimposed patterns; and determining a touch pattern as a touch layer pattern from the at least two touch patterns according to equivalent grayscales of the at least two superimposed patterns.

At least one embodiment of the present disclosure provides a computer device, comprising a memory, a processor, and computer programs stored on the memory and executable on the processor, wherein the processor is configured to perform the following operations:

providing a pixel pattern including a light shielding region and a sub-pixel region defined by the light shielding region;

superimposing at least two different touch patterns with the pixel pattern respectively to obtain at least two superimposed patterns; and determining, a touch pattern as a touch layer pattern from the at least two touch patterns according to equivalent grayscales of the at least two superimposed patterns.

Optionally, said determining, according to the equivalent grayscales of the at least two superimposed patterns, one touch pattern as the touch layer pattern from the at least two touch patterns comprises:

dividing the superimposed pattern into a plurality of first regions;

calculating an equivalent grayscale value of each of the first regions;

calculating a variance according to the equivalent grayscale value of each of the first regions; and selecting one touch pattern as the touch layer pattern from the touch patterns whose variances are less than a set value.

Optionally, said selecting one touch pattern as the touch layer pattern from the touch patterns whose variances are less than the set value comprises:

selecting a touch pattern with the smallest variance as the touch layer pattern from the touch patterns whose variances are less than the set value.

Optionally, each of the first regions comprises a first lower layer region located on the pixel pattern and a first upper layer projection region located on the touch pattern; said calculating the equivalent grayscale value of each of the first regions comprises:

setting the equivalent grayscale value of the first region as 0 when the first lower layer region of the first region is located in the light shielding region; and calculating the equivalent grayscale value of the first region according to the following formula when the first lower layer region of the first region is located in the sub-pixel region, N=255*$K_2$, where $K_2$ is a light transmittance of the touch pattern in the first upper layer projection region of the first region, and 0<$K_2$≤1.

Optionally, said calculating an equivalent grayscale value of each of the first regions comprises:

dividing each of the first regions into a plurality of second regions;

calculating an equivalent grayscale value of each of the second regions; and taking an average value of the equivalent grayscale values of all of the second regions in each of the first regions as an equivalent grayscale value of the first region.

Optionally, each of the second regions comprises a second lower layer region located on the pixel pattern and a second upper layer projection region located on the touch pattern, and an orthographic projection, on the touch pattern, of the second lower layer region coincides with the second upper layer projection region.

Optionally, each of the second regions comprises a second lower layer region located on the pixel pattern and a second upper layer projection region located on the touch pattern; said dividing each of the first regions into a plurality of second regions comprises:

designating a reference point on the touch pattern, and designating an observation point on a straight line perpendicular to the touch pattern with the reference point as a perpendicular foot, the touch pattern being located between the observation point and the pixel pattern;

dividing the pixel pattern into a plurality of second lower layer regions; and taking a region surrounded by the oblique projection points, on the touch pattern, of an edge points of the second lower layer region as the corresponding second upper layer projection region, wherein the edge point, the oblique projection point of the edge point on the touch pattern and the observation point satisfying the following relationship:

a light emitted from a point light source disposed at the edge point and passing through the oblique projection point, on the touch pattern, of the edge point can pass through the observation point after passing through the touch pattern.

Optionally, wherein a distance L between the edge point and the reference point, and a distance x between the oblique projection point, on the touch pattern, of the edge point and the reference point satisfy the following equation:

$$L = \frac{d \cdot x}{\sqrt{(n^2 - 1)x^2 + n^2(h - d)^2}} + x,$$

where d is a thickness of the color film substrate, n is a refractive index of the color film substrate, and h is a distance between the observation point and the pixel pattern, and h>d.

Optionally, said calculating the equivalent grayscale value of each of the second regions comprises:

setting the equivalent grayscale value of the second region as when the second lower layer region of the second region is located in the light shielding region 0; and calculating the equivalent grayscale value of the second region according to the following formula when the second lower layer region of the second region is located in the sub-pixel region, $N=255*K_3$, where $K_3$ is a light transmittance of the touch pattern in the second upper layer projection region, and $0<K_3 \leq 1$.

At least one embodiment of the present disclosure provides a storage medium on which at least one instruction is stored, wherein the instruction is loaded and performed by a processor to implement the operations performed in any one of the determination methods for the touch layer pattern.

DETAILED DESCRIPTION

The embodiments of the present disclosure will be described in further detail with reference to the accompanying drawings, to present the principles and advantages of the present disclosure more clearly.

Figure 1:
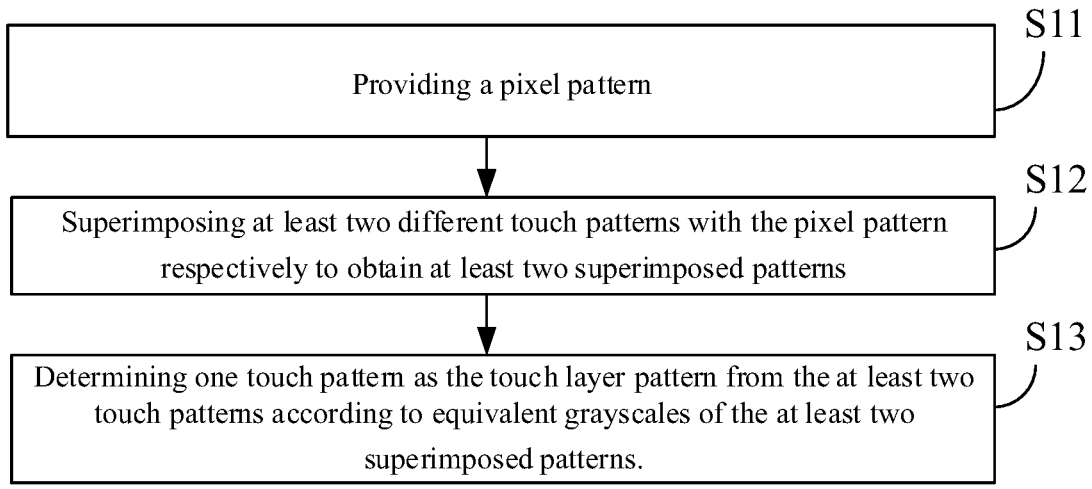
FIG. 1 is a flow chart of a determination method for a touch layer pattern according to an embodiment of the present disclosure.

FIG. 1 is a flow chart of a determination method for a touch layer pattern according to an embodiment of the present disclosure. As shown in FIG. 1, the method include the following steps.

In step S11, a pixel pattern is provided.

Herein, the pixel pattern includes a light shielding region and a sub-pixel region defined by the light shielding region.

In step S12, at least two different touch patterns are superimposed with the pixel pattern respectively to obtain at least two superimposed patterns.

In step S13, one touch pattern is determined as the touch layer pattern from the at least two touch patterns according to equivalent grayscales of the at least two superimposed patterns.

The equivalent grayscale refers to the grayscale value of the physical object corresponding to the pixel pattern after the touch pattern in the superimposed pattern and the physical object are superimposed and then placed in front of illuminated backlight.

At least two different touch patterns are superimposed with the pixel pattern respectively to obtain the superimposed patterns, and then one touch pattern is determined as the touch layer pattern from the at least two touch patterns according to equivalent grayscales of the superimposed patterns. Since the equivalent grayscales of the superimposed patterns can reflect the obvious degree of the moire pattern formed by a light that passes through the color film substrate and the touch layer when the touch layer is arranged on the color film substrate having the pixel pattern, the touch pattern with less obvious moire pattern may be selected as the touch layer pattern, which is beneficial to reduce the influence of the moire pattern on the display effect of the touch display device.

Figure 2:
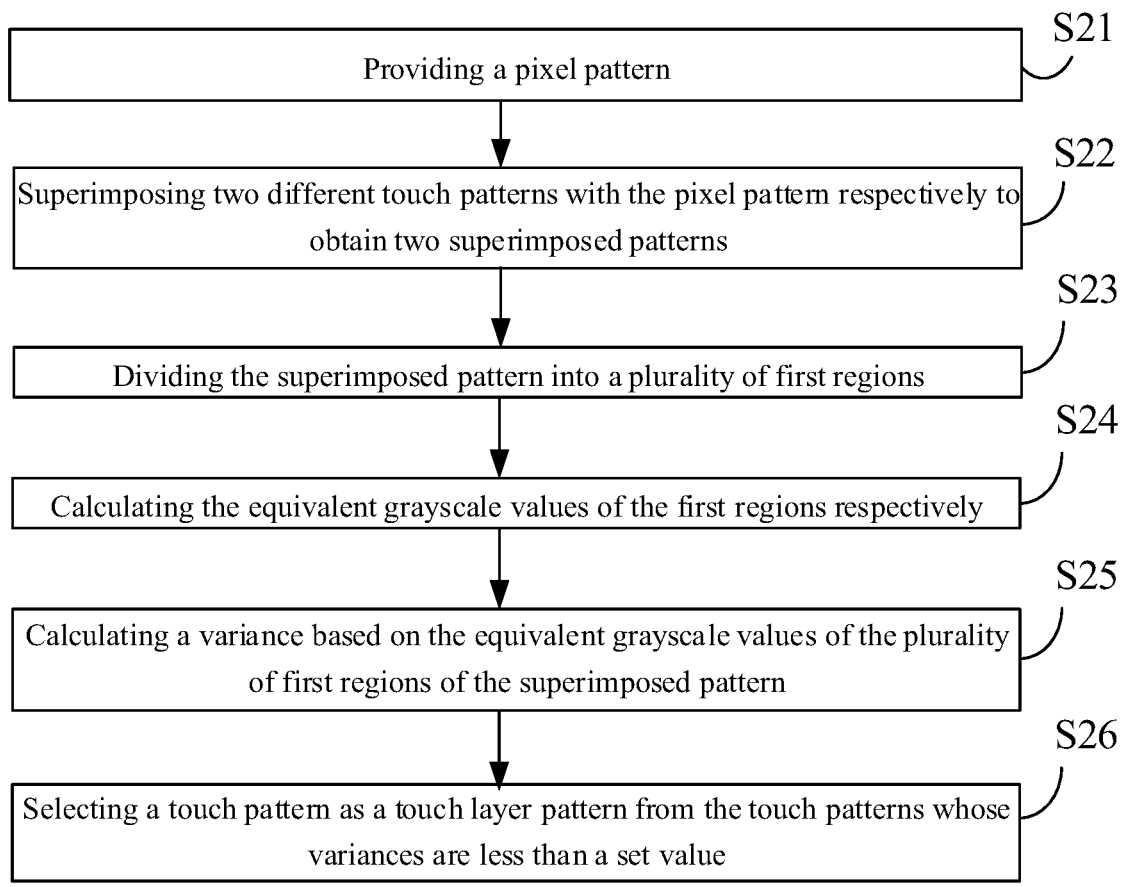
FIG. 2 is a flow chart of a determination method for a touch layer pattern according to an embodiment of the present disclosure.

FIG. 2 is a flow chart of a determination method for a touch layer pattern according to an embodiment of the present disclosure. The method applies to determining one touch pattern from two different touch patterns. As shown in FIG. 2, the method includes the following steps.

In step S21, a pixel pattern is provided.

The pixel pattern includes a light shielding region and a sub-pixel region defined by the light shielding region.

In step S22, two different touch patterns are superimposed with the pixel pattern respectively to obtain two superimposed patterns.

Figure 3:
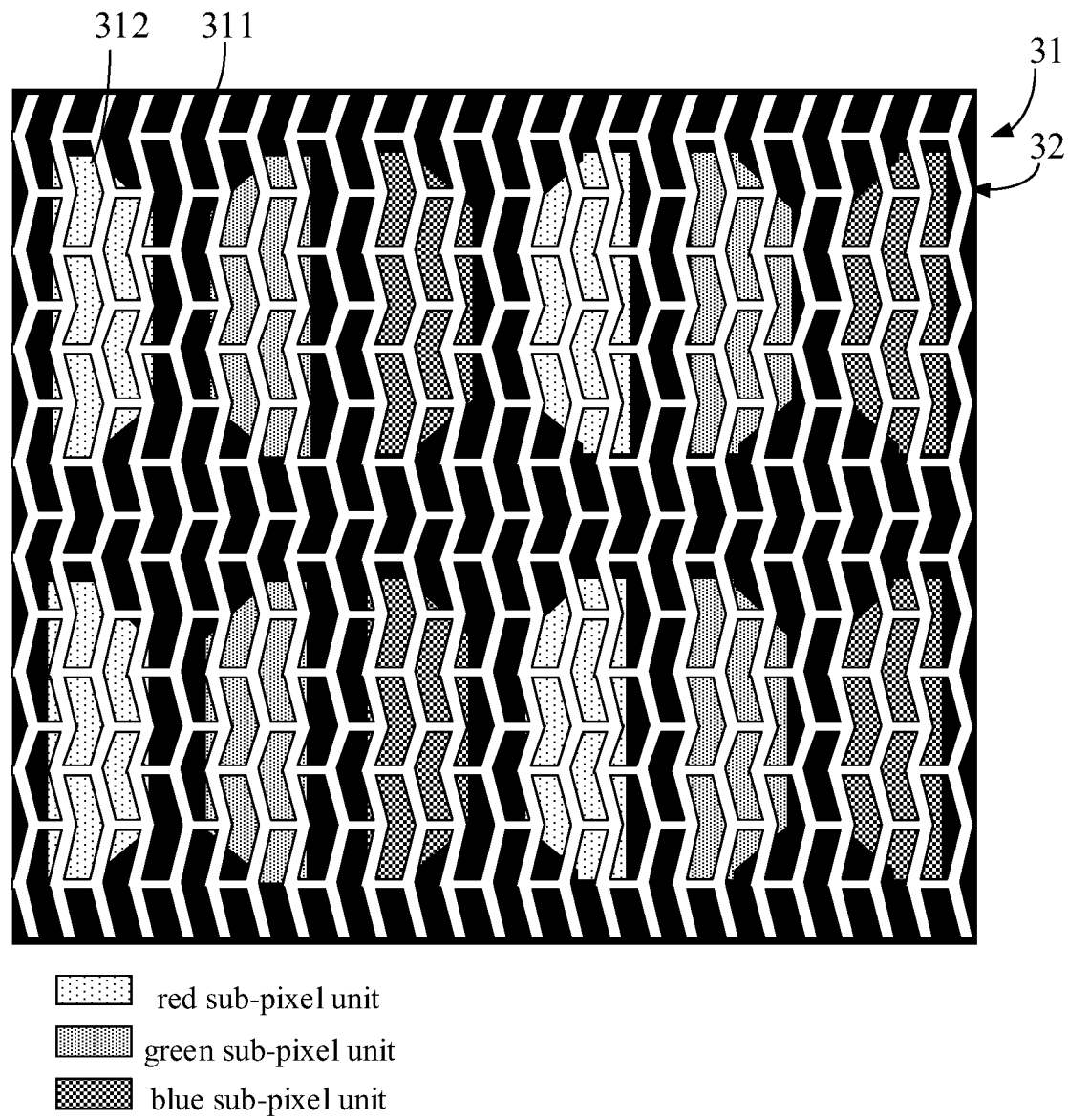
FIG. 3 is a schematic diagram of a superimposed pattern according to an embodiment of the present disclosure.

FIG. 3 is a schematic diagram of a superimposed pattern provided by an embodiment of the present disclosure. The superimposed pattern is formed by superimposing a touch pattern 32 with a pixel pattern 31. As shown in FIG. 3, the pixel pattern 31 comprises a light shielding region 311 and a sub-pixel region 312 defined by the light shielding region 311.

In a touch display device, the touch pattern and the pixel pattern are both of periodic structure. Therefore, in order to improve the execution efficiency, in step S22, a repetition period may be selected from the entire touch pattern, and a repetition period may be selected from the entire pixel pattern, wherein the areas of the two repetition periods are equal. The two repetition periods are superimposed. After the touch layer pattern is determined, the complete structure of the touch layer pattern is obtained according to the repetition periods. In order to ensure that the areas of the two repetition periods are equal, the repetition period selected from the touch pattern and the repetition period selected from the pixel pattern may not be the minimum period.

It should be noted that, the embodiment of the present disclosure may be described by determining one touch pattern from two touch patterns as an example, and one touch pattern may be determined from a plurality of touch patterns in practice. For example, one touch pattern is determined from 100 different touch patterns, correspondingly, 100 different touch patterns need to be superimposed with the pixel pattern respectively, thereby obtaining 100 superimposed patterns. In addition, the shape of the sub-pixel region 312 shown in FIG. 3 is also an example. The sub-pixel region 312 may also be configured as other geometric shapes, for example, may be configured as a rectangle, a circle, a triangle, etc.

Figure 4:
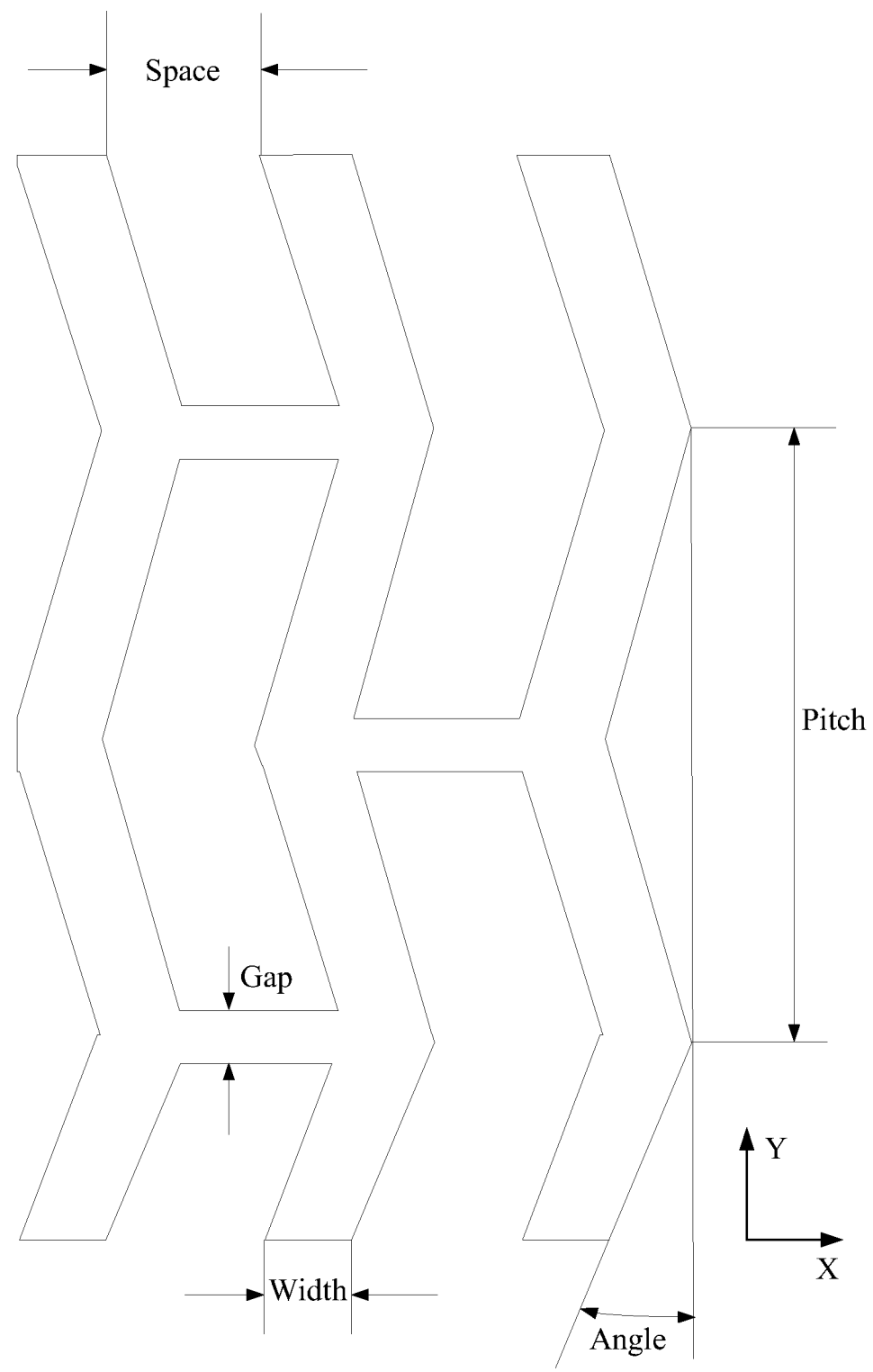
FIG. 4 is a schematic diagram of a repetition period of the touch pattern in the superimposed pattern shown in FIG. 3.

The touch pattern may be generated according to touch pattern parameters. The touch pattern parameters may include a plurality of parameters. FIG. 4 is a schematic diagram of a repetition period of the touch pattern in the superimposed pattern shown in FIG. 3. The touch pattern parameters of the touch pattern may include a line width (Width) of a main body portion (e.g., a dimension of the main body portion in an X direction in FIG. 4), a bending angle (Angle) of the main body portion (e.g., an included angle between an extending direction of the main body portion and a Y direction in FIG. 4), a repetition period (Pitch) of the main body portion, a line width (Gap) of a branch connecting two adjacent main body portions, and a width (Space) of the gap between two adjacent main body portions. When generating a touch pattern, a large number of touch pattern parameters may be combined (for example, 1000 to 100000 groups are obtained by combining) to obtain a plurality of different touch patterns. Compared with a production process in which the resulting products are detected to select a touch pattern having an unobvious moire pattern, the present method in which the combination of the touch pattern parameters is determined to guide the design of the touch pattern may reduce the development cost of the touch pattern and shorten the development cycle of the touch pattern. Taking the touch pattern shown in FIG. 4 as an example, the value of Width may range from 7 μm to 70 μm, the value of Angle may range from 10° to 40°, the value of Pitch may range from 20 μm to 600 μm, the value of Gap may range from 6 μm to 15 μm, and the value of Space may range from 6 μm to 50 μm. By combining the values of these touch pattern parameters within the corresponding ranges, different touch patterns may be obtained.

Taking the touch pattern shown in FIG. 4 as an example, even if the touch pattern parameters of the two touch patterns are the same in type (i.e., the shapes of the touch patterns are the same, and the touch pattern parameters of both include Width, Angle, Pitch, Gap, Space), the two touch patterns may be different as long as at least one touch pattern parameter of the two touch patterns has different value. In addition, the touch pattern parameters of the two touch patterns include different types of parameters (i.e., the shapes of the touch patterns are different), and the two touch patterns may also be different, as shown in FIG. 5 and FIG. 6, for example.

Figure 5:
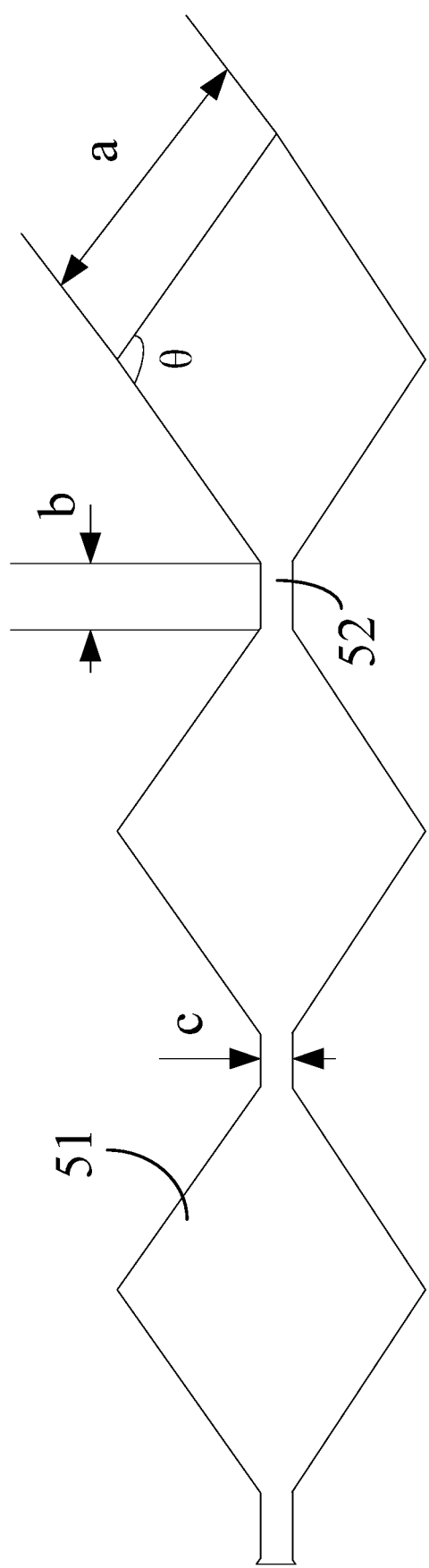
FIG. 5 is partially schematic diagram of another touch pattern.

FIG. 5 is a partially schematic diagram of a touch pattern. FIG. 5 shows only part of the touch pattern, and a plurality of touch electrodes shown in FIG. 5 is included in the complete touch pattern. As shown in FIG. 5, the touch electrodes include rhombic electrodes 51 which are connected by connection portions 52. In the complete touch pattern, a plurality of touch electrodes are arranged in an intersecting manner, so that the rhombic electrodes 51 are distributed in an array. For the touch pattern shown in FIG. 5, the touch pattern parameters may include a side length a of the rhombic electrode 51, a vertex angle θ of the rhombic electrode 51, a length b of the connection portion 52, and a width c of the connection portion 52.

Figure 6:
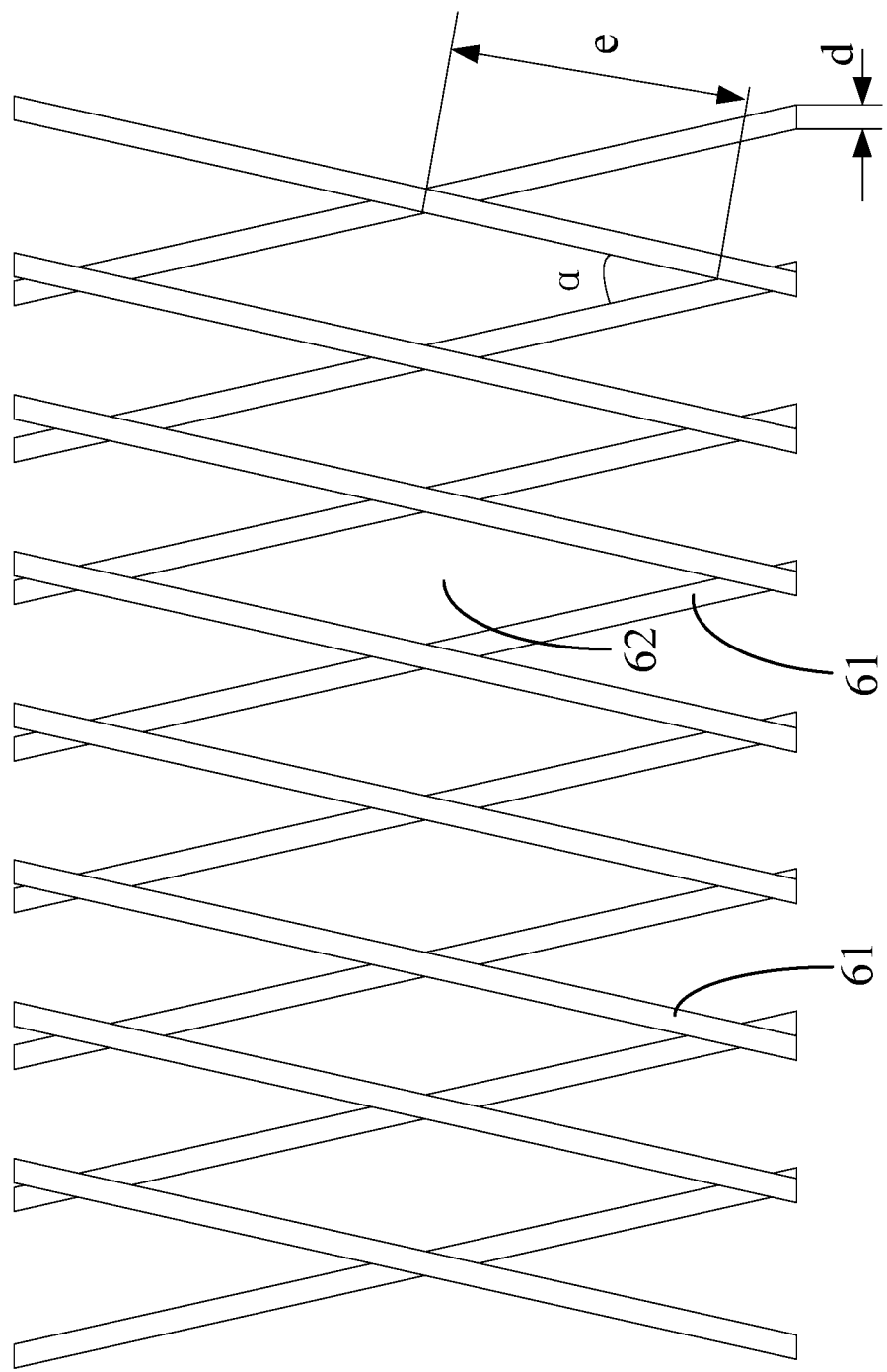
FIG. 6 is partially schematic diagram of yet another touch pattern.

FIG. 6 is a partially schematic diagram of a touch pattern. As shown in FIG. 6, the touch pattern comprises a plurality of metal lines 61 which are intersected to form a plurality of rhombuses 62. The metal lines 61 are insulated from each other at their intersections. For the touch pattern shown in FIG. 6, the touch pattern parameters may include a side length e of the rhombus 62, a vertex angle α of the rhombus 62, and a width d of the metal line 61.

It should be noted that the structure of the above touch pattern is only an example, and is not intended to limit the present disclosure. The touch pattern may also be a square, triangle, etc. For touch patterns of different shapes (e.g., the shape of the touch pattern shown in FIG. 5 and the shape of the touch pattern shown in FIG. 6), the parameters included in the touch pattern parameters may also be different in type. In practical applications, this method is also applicable to other touch patterns that are not enumerated, and is applicable to a single-layer touch layer (e.g., the touch layer shown in FIG. 3) and a double-layer touch layer (e.g., a common touch layer formed by the intersected electrodes in the structure shown in FIG. 5).

In step S23, the superimposed pattern is divided into a plurality of first regions.

After the superimposed pattern is divided into a plurality of first regions, each of the first regions includes a first lower layer region located on the pixel pattern and a first upper layer projection region located on the touch pattern.

Figure 7:
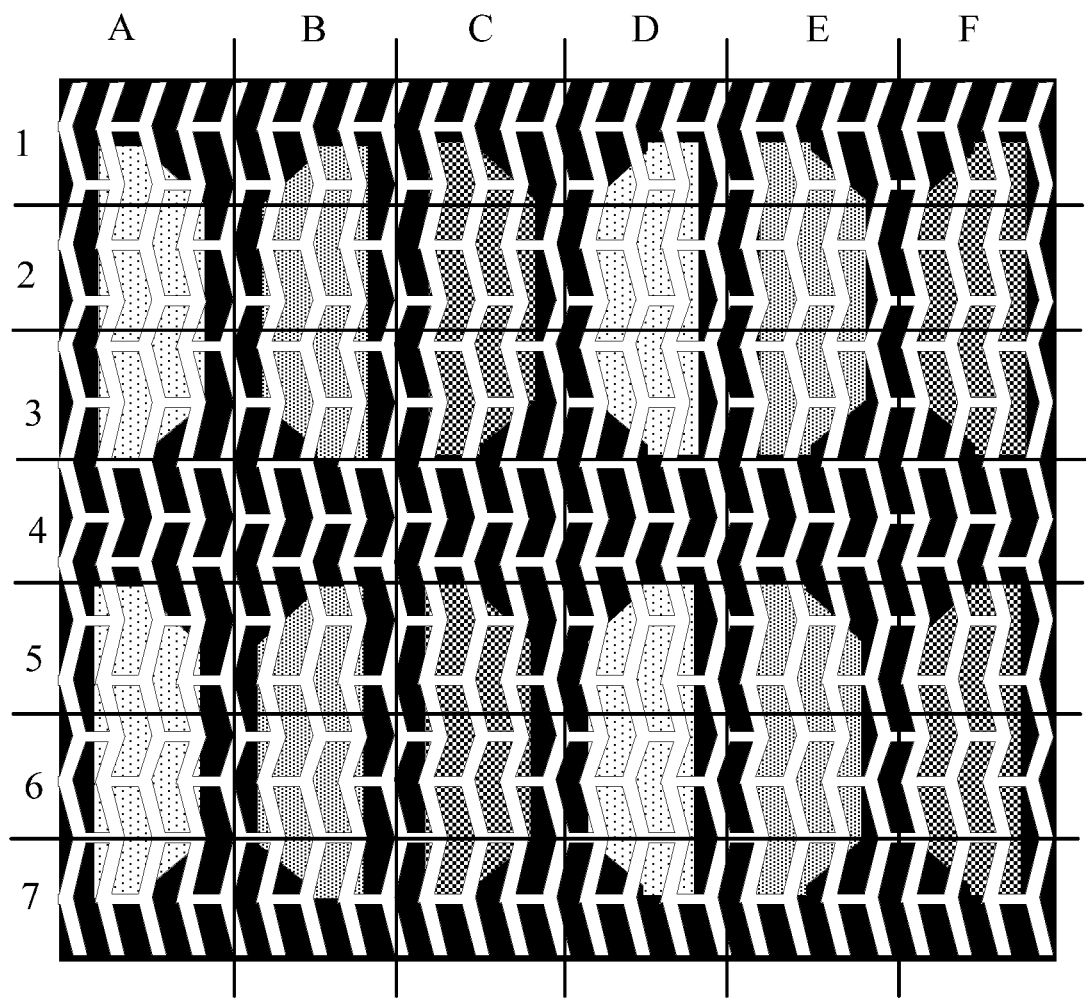
FIG. 7 is a distribution diagram of first region according to an embodiment of the present disclosure.

FIG. 7 is a distribution diagram of first regions provided by an embodiment of the present disclosure. As shown in FIG. 7, the superimposed pattern is divided into a plurality of first regions (e.g., first regions 1A, 1B, . . . , 1F, 2A, 2B, . . . , 2F, . . . , 7F in FIG. 7) which are distributed in a matrix, wherein the Arabic numeral indicates the row where the first region is located, and the uppercase English letter indicates the column where the first region is located. The areas of the respective first regions are equal.

It should be noted that thin solid lines in FIG. 7, which intersect transversely and longitudinally and whose two ends extend out of the superimposed pattern, are auxiliary lines for identifying the boundaries of the first regions, and are not of a structure actually existing on the superimposed pattern.

Taken the same areas of the superimposed patterns, the more the number of the divided first regions is, the more accurately a better touch pattern can be determined in the subsequent steps. The more the number of the first regions is, the more cumbersome and inefficient the processing procedure in the subsequent steps is. In actual processing, the superimposed pattern can be divided into a proper number of first regions by considering the accuracy of the results and the production efficiency comprehensively.

When the superimposed pattern is divided into a plurality of first regions, it is only necessary to ensure that the areas of the respective first regions are equal, and there is no overlapping region therebetween. The division manner shown in FIG. 7 is only an example.

When dividing the first regions, the area of each of the first regions may be the area of several pixel regions, for example, may be set to the area of 1 to 3 pixel regions. If the area of the first region is set to be too large, it is difficult to accurately determine a better touch pattern. At present, a side length of one pixel region is usually 50 to 200 μm, and one pixel region usually includes three sub-pixel regions.

Exemplarily, the area of the first region may be equal to the area of one pixel region, that is, each first region exactly includes one pixel region. For example, a pixel pattern with a resolution of 9*9 which includes 9*9 pixel regions, may be divided into 9*9 first regions.

The area of the first region may also be less than the area of one pixel region. For example, in the first region shown in FIG. 7, each pixel region is divided into a plurality of first regions. The first region may be rectangular or square.

In step S24, the equivalent grayscale values of the first regions are calculated respectively.

In the embodiment of the present disclosure, the equivalent grayscale value of a region of the superimposed pattern refers to the grayscale value of the physical object corresponding to the pixel pattern after the touch pattern in the superimposed pattern and the physical object are superimposed and then placed in front of illuminated backlight.

In a possible implementation, the equivalent grayscale value of each first region may be calculated according to the following formula:

$$N = a - 255 * K_1 \quad (1)$$

herein, when the first lower layer region of the first region is located in the light shielding region, where a=0; when the first lower layer region of the first region is located in the sub-pixel region, where a=255; $K_1$ is a sum of the reflectivity and the absorptivity of the touch pattern in the first upper layer projection region of the first region, and $0 \leq K_1 < 1$.

The touch pattern is usually made of a transparent conductive material, such as ITO (Indium Tin Oxide). The touch pattern comprises an electrode region (e.g., a white region of the touch pattern in FIG. 7) and a non-electrode region (e.g., a region other than the white region of the touch pattern in FIG. 7). A sum of the reflectivity and the absorptivity of the electrode region is generally 5% to 15%. A sum of the reflectivity and the absorptivity of the non-electrode region of the touch pattern is 0.

Figure 8:
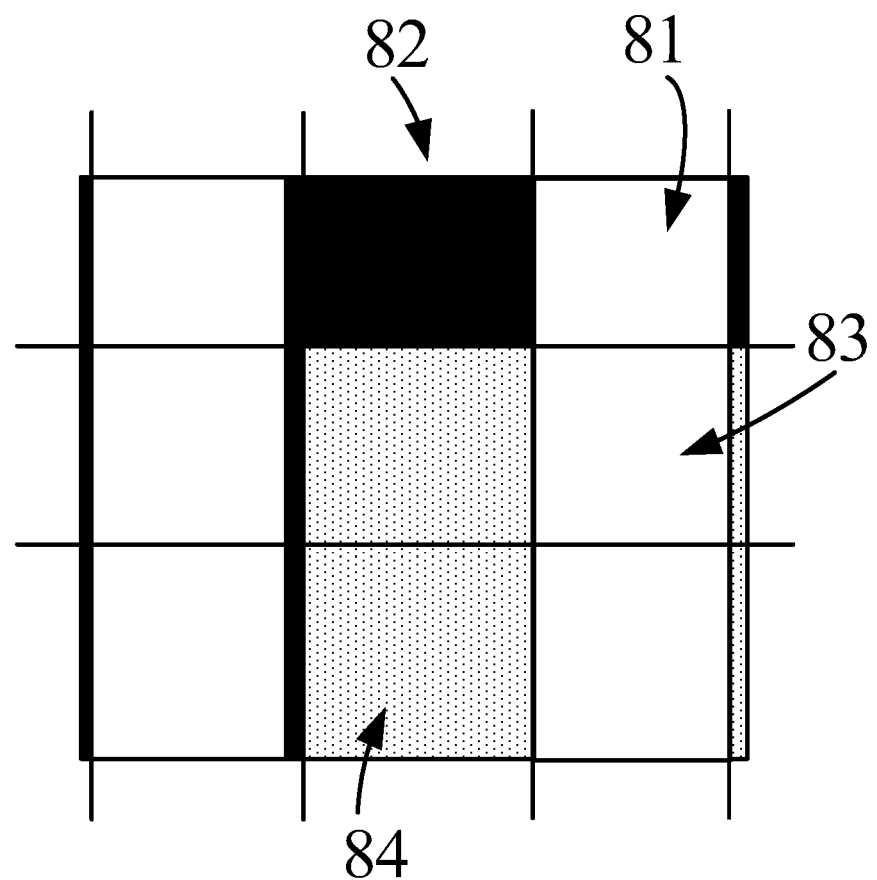
FIG. 8 is a partially enlarged schematic diagram of a superimposed pattern according to an embodiment of the present disclosure.

FIG. 8 is a partially enlarged schematic diagram of a superimposed pattern provided by an embodiment of the present disclosure. Herein, the thin solid lines, which intersect transversely and longitudinally and whose two ends extend out of the superimposed pattern, are auxiliary lines for identifying the boundaries of the first regions, and are not of a structure actually existing on the superimposed pattern. The embodiment of the present disclosure is described by taking $K_1=10\%$ of the electrode region and $K_1=0$ of the non-electrode region as an example. As shown in FIG. 8, the first lower layer region of the first region 81 and the first lower layer region of the first region 82 are both located in the light shielding region of the pixel pattern, where a=0; the part of the touch pattern in the first upper layer projection region of the first region 81 is located in the electrode region, where $K_1=10\%$; and the part of the touch pattern in the first upper layer projection region of the first region 82 is located in the non-electrode region, where $K_1=0$. According to the formula (1), the equivalent grayscale value of the first region 81 may be calculated to be −25.5, and the equivalent grayscale value of the first region 82 is 0. The first lower layer region of the first region 83 and the first lower layer region of the first region 84 are located in a sub-pixel region of the pixel pattern, where a=255; the part of the touch pattern in the first upper layer projection region of the first region 83 is located in the electrode region, where $K_1=10\%$; and the part of the touch pattern in the first upper layer projection region of the first region 84 is located in the non-electrode region, where $K_1=0$. According to the formula (1), the equivalent grayscale value of the first region 83 may be calculated to be 229.5, and the equivalent grayscale value of the first region 84 is 255.

Optionally, the equivalent grayscale value of each first region may also be calculated in the following manner to further improve the accuracy of the result.

When the first lower layer region of the first region is located in the light shielding region, the equivalent grayscale value of the first region is 0; and when the first lower layer region of the first region is located in the sub-pixel region, the equivalent grayscale value of the first region is calculated according to the following formula, $$N = 255 * K_2 \quad (2)$$

where $K_2$ is a light transmittance of the touch pattern in the first upper layer projection region of the first region, $0 < K_2 \leq 1$.

The light transmittance $K_2$ of the electrode region is generally 85% to 95%, and the light transmittance $K_2$ of the non-electrode region is 100%. The touch pattern is usually made of a transparent conductive material, and the light transmittance of the electrode region is the light transmittance of the transparent conductive material in the touch pattern. The light transmittance is a physical term to describe the ability of a medium to permit light to penetrate. The light transmittance is the ratio of luminous flux through the medium to luminous flux incident the medium in percentage. In some embodiments of the present disclosure, the light transmittance of the transparent conductive material may be measured by a light transmittance tester. Alternatively, by arranging a light source on one side of a transparent plate and a brightness meter on the other side of the transparent plate which may be a glass substrate, and measuring the brightness of the light source by the brightness meter, and then, arranging a layer of transparent conductive material on the transparent plate, and measuring the brightness of the light source by the brightness meter again, the light transmittance of the transparent conductive material is the ratio of the brightness measured for the second time to the brightness measured for the first time. Since the light transmittance of the transparent conductive material is related to the thickness of the transparent conductive material, when measuring the light transmittance of the transparent conductive material, the thickness of the transparent conductive material should be the same as the thickness of the touch pattern.

The embodiment of the present disclosure is described by taking $K_2=90\%$ of the electrode region and $K_2=100\%$ of the non-electrode region as an example. Similarly, the equivalent grayscale values of the plurality of first regions as shown in FIG. 8 are calculated. When the calculation is performed by this method, the equivalent grayscale values of the first region 81 and the first region 82 are both 0, the equivalent grayscale value of the first region 83 is 229.5, and the equivalent grayscale value of the first region 84 is 255. The value of the grayscale value usually ranges from 0 to 255, and there is no case where the grayscale value is negative. When the calculation is performed by this method, the situation where the calculated equivalent grayscale value is negative may be avoided, such that the final result is more accurate.

Figure 9:
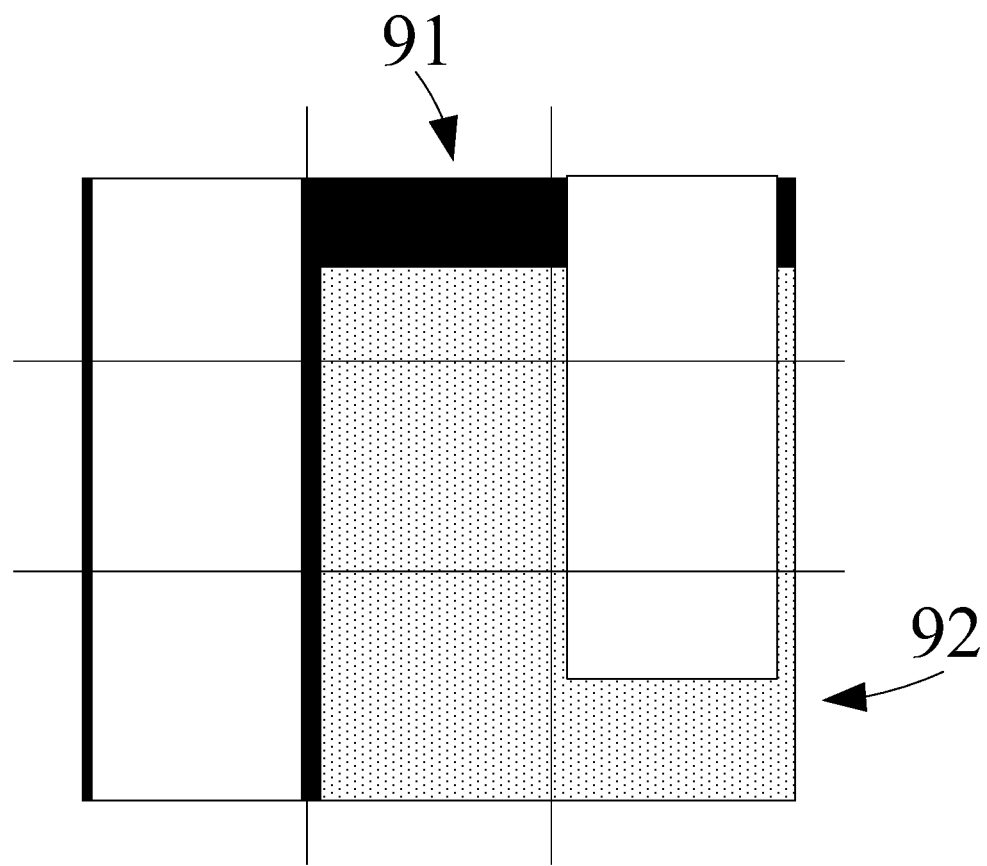
FIG. 9 is a partially enlarged schematic diagram of a superimposed pattern according to an embodiment of the present disclosure.

FIG. 9 is a partially enlarged schematic diagram of a superimposed pattern provided by an embodiment of the present disclosure. Herein the thin solid lines, which intersect transversely and longitudinally and whose two ends extend out of the superimposed pattern, are auxiliary lines for identifying the boundaries of the first regions, and are not of a structure actually existing on the superimposed pattern. As shown in FIG. 9, a part of the first lower layer region of the first region 91 is located in the light shielding region, and another part thereof is located in the sub-pixel region. When calculating the equivalent grayscale value of such a first region, it may be processed in the following manner:

if the area of the first lower layer region of a first region in the sub-pixel region is not less than the area of the first lower layer region of the first region in the light shielding region, the first lower layer region of the first region may be considered to be located in the sub-pixel region, where a=255; if the area of the first lower layer region of a first region in the sub-pixel region is less than the area of the first lower layer region of the first region in the light shielding region, the first lower layer region of the first region may be considered to be located in the light shielding region, where a=0.

As shown in FIG. 9, a part of the first upper layer projection region of the first region 92 is located in the electrode region of the touch pattern, and another part thereof is located in the non-electrode region of the touch pattern. In the case of calculating an equivalent grayscale value of such first region, a method similar to the aforementioned method calculating the equivalent grayscale value of the first region 91 may be employed, for example, as follows:

if the area of the first upper layer projection region of a first region in the electrode region is not less than the area of the first upper layer projection region of the first region in the non-electrode region, the entire first upper layer projection region of the first region may be considered to be located in the electrode region; if the area of the first upper layer projection region of the first region in the electrode region is less than the area of the first upper layer projection region of the first region in the non-electrode region, the entire first upper layer projection region of the first region may be considered to be located in the non-electrode region The approximation process performed by the above method can simplify the calculation process and greatly improve the processing efficiency.

Figure 10:
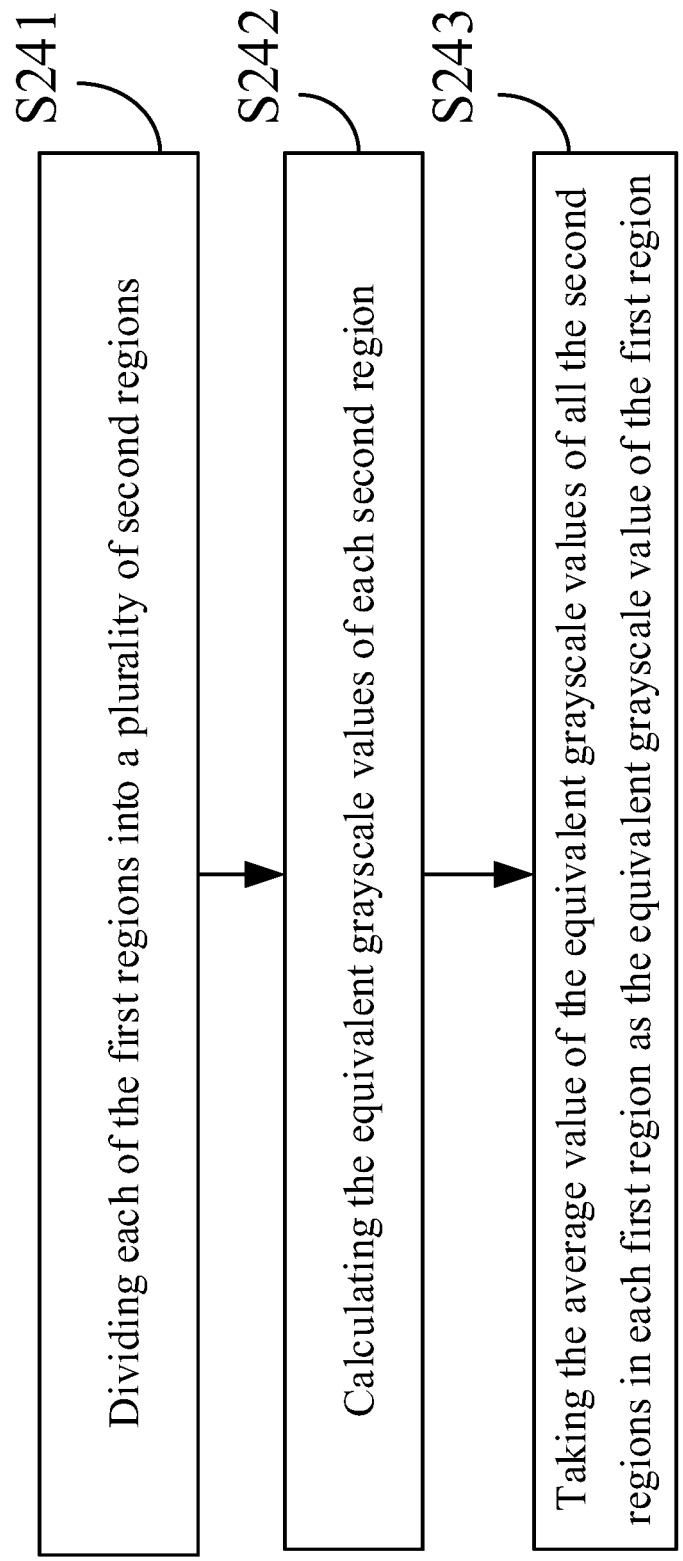
FIG. 10 is a flow chart of a method for calculating an equivalent grayscale value of the first region according to an embodiment of the present disclosure.

In addition, the embodiment of the present disclosure further provides another method for calculating an equivalent grayscale value of the first region, as shown in FIG. 10, which may comprise the following steps.

In step S241, each of the first regions is divided into a plurality of second regions.

Figure 11:
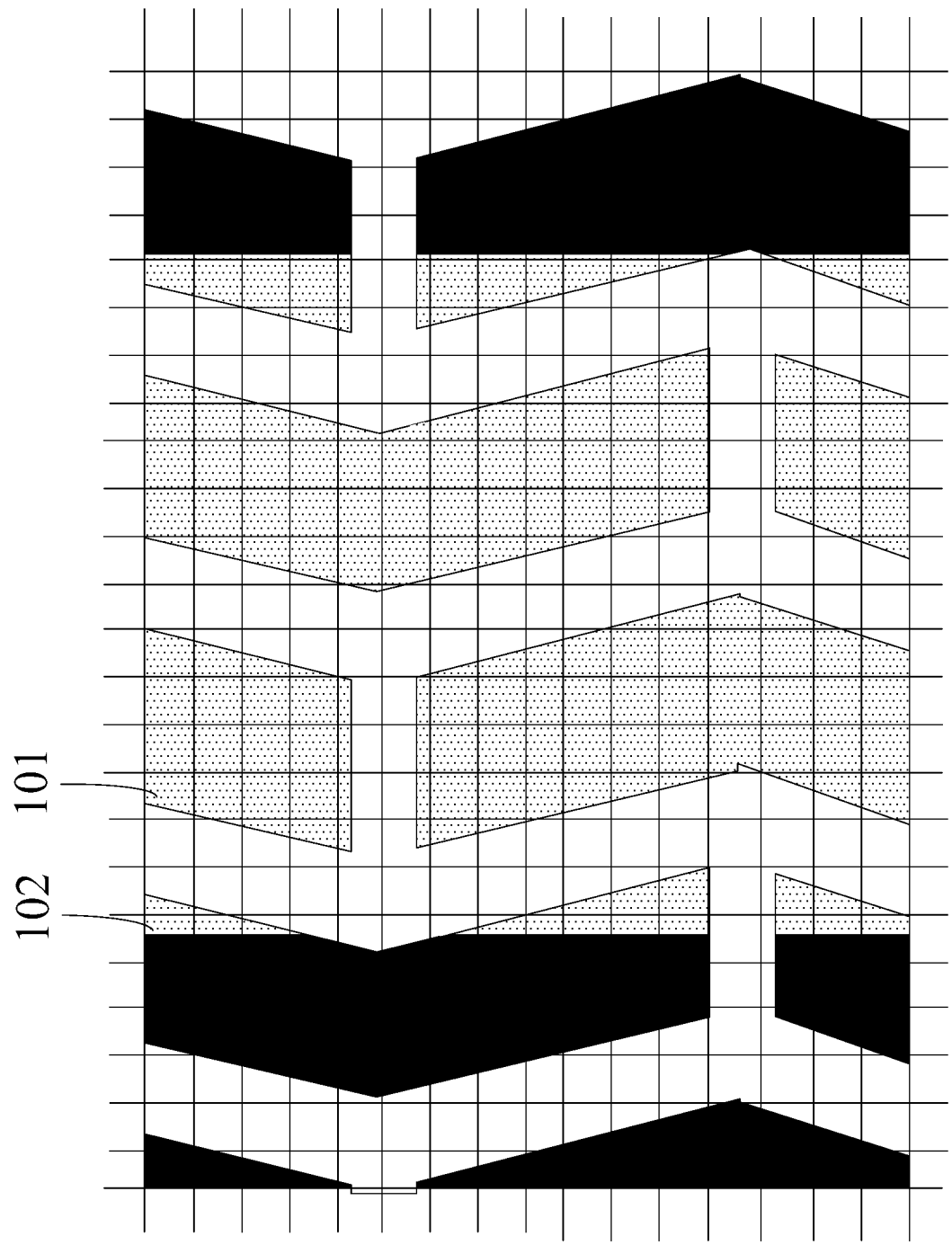
FIG. 11 is an enlarged schematic diagram of the first region 2A in FIG. 7.

FIG. 11 is an enlarged schematic diagram of the first region 2A in FIG. 7. As shown in FIG. 11, the first region is divided into a plurality of second regions that are distributed in a matrix. The areas of the respective second regions are equal.

When the first region is divided into a plurality of second regions, it is only necessary to ensure that the areas of the respective second regions are equal, and there is no overlapping region therebetween. The division manner shown in FIG. 11 is only an example.

The second region may be square. A side length of the square may be 1 to 2.5 μm. When the first region is divided into the second regions, it is ensured that the first region may be just divided into an integer number of second regions. In the actual division process, the second region may be rectangular or square.

Each of the second regions includes a second lower layer region located on the pixel pattern and a second upper layer projection region located on the touch pattern.

In step S242, the equivalent grayscale values of each second region are calculated.

In step S243, the average value of the equivalent grayscale values of all the second regions in each first region is taken as the equivalent grayscale value of the first region.

After the first region is further divided into a plurality of second regions, the equivalent grayscale value of the first region may be calculated more accurately, which is advantageous to determine a better touch pattern more accurately.

In the case of calculating the equivalent grayscale values of the second regions, the equivalent grayscale value of each second region may be calculated according to the formula (1) by the aforementioned method of calculating the equivalent grayscale value of the first region.

In the case of calculating the equivalent grayscale value of the second region according to formula (1), the meanings of parameters in the formula are correspondingly adjusted. Herein, when the second lower layer region of the second region is located in the light shielding region, a=0. When the second lower layer region of the second region is located in the sub-pixel region, a=255. $K_1$ is a sum of the reflectivity and the absorptivity of the touch pattern in the second upper layer projection region of the second region, and $0 \leq K_1 < 1$.

Alternatively, when the second lower layer region of the second region is located in the light shielding region, the equivalent grayscale value of the second region is 0.

When the second lower layer region of the second region is located in the sub-pixel region, the equivalent grayscale value of the second region is calculated according to the following formula:

$$N=255*K_3 \qquad (3)$$

where $K_3$ is the light transmittance of the touch pattern in the second upper layer projection region of the second region, and $0 < K_3 \leq 1$.

When the equivalent grayscale value of the second region is calculated, there may be a case where a part of the second upper layer projection region of the second region is located in the electrode region of the touch pattern, and another part thereof is located in the non-electrode region of the touch pattern (e.g., the second region 101). There may also be a case where a part of the second lower layer region of the second region is located in the light shielding region, and the another thereof is located in the sub-pixel region (e.g., the second region 102). In these cases, the aforementioned approximation method of calculating the equivalent grayscale value of the first region may also be used to simplify the calculation process and improve the processing efficiency.

Figure 12:
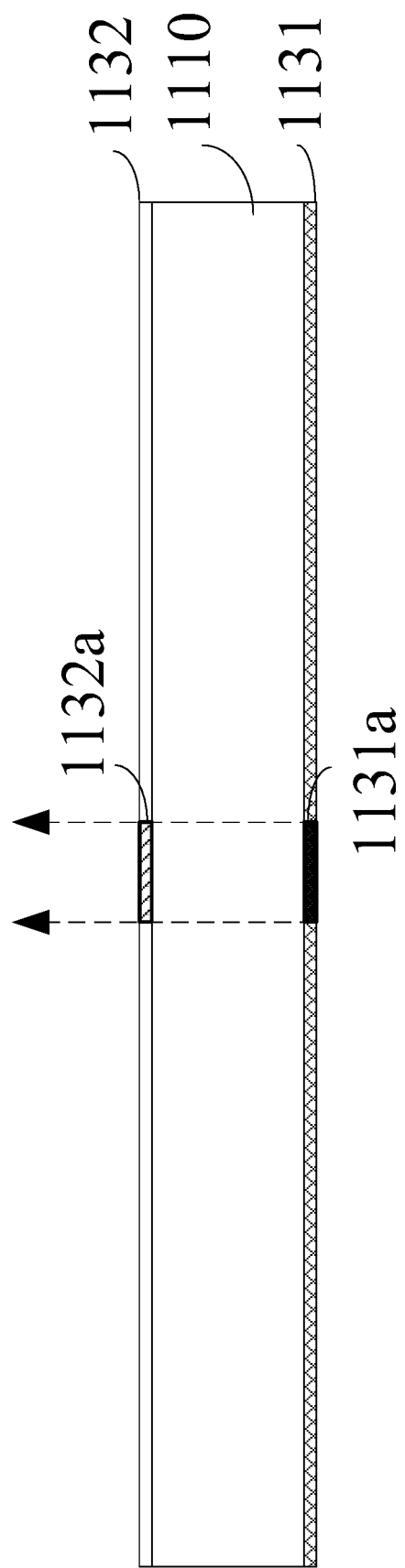
FIG. 12 is a sectional view of FIG. 11.

FIG. 12 is a sectional view of FIG. 11. As shown in FIG. 12, in the same second region, an orthographic projection, on the touch pattern, of the second lower layer region coincides with the second upper layer projection region. In FIG. 12, taking the second lower layer region 1131a on the pixel pattern 1131 as an example, an orthographic projection, on the touch pattern 1132, of the second lower layer region 1131a coincides with the second upper layer projection region 1132a. A light emitted from the pixel pattern is refracted when being incident on a color film substrate and exiting from the color film substrate, and then reaches observer's eyes. However, since the color film substrate 1110 is very thin, when calculating the equivalent grayscale of the second region it may be approximately considered that the light passes through the pixel pattern and the touch pattern vertically. Therefore, the processing procedure may be simplified to facilitate improving the efficiency.

Figure 13:
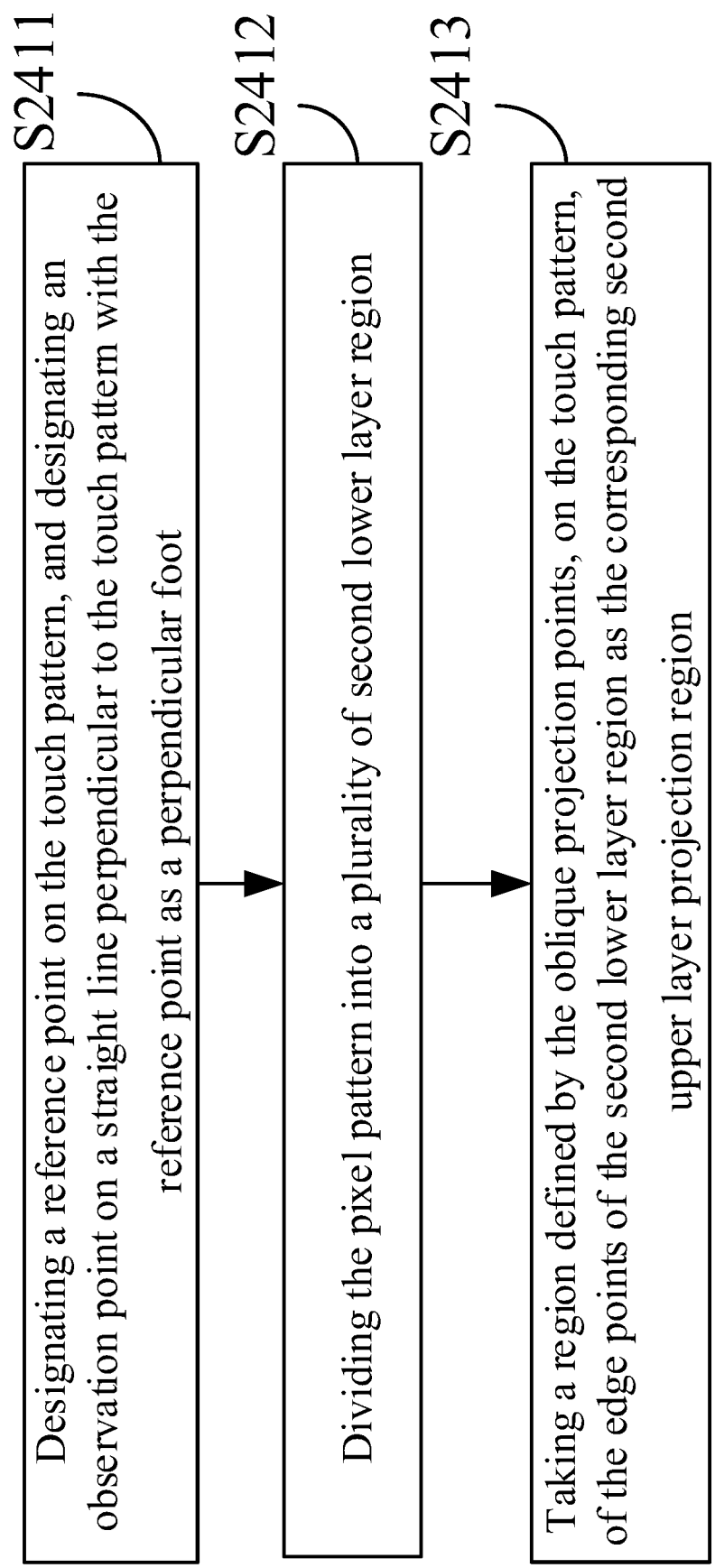
FIG. 13 is a flow chart of a method of dividing a second region according to an embodiment of the present disclosure.

Optionally, there is another manner to divide each of the first regions into a plurality of second regions. The method of dividing the second regions is shown in FIG. 13. After the division is completed in this manner, each of the second regions includes a second lower layer region and a corresponding second upper layer projection region. An orthographic projection, on the touch pattern, of the second lower layer region does not coincide with the corresponding second upper layer projection region. This division manner may refer to FIG. 14, for example, as follows.

In step S2411, a reference point is designated on the touch pattern. An observation point is designated on a straight line perpendicular to the touch pattern with the reference point as a perpendicular foot. The touch pattern is located between the observation point and the pixel pattern. That is, the reference point 1132c is an orthographic projection, on the touch pattern 1132, of the observation point 1133.

Optionally, a distance between the observation point and the pixel pattern is h, and 130 mm≤h≤500 mm. For most of the touch display devices in use, a distance between the human eye and the display device is usually between 130 mm and 500 mm. The farther the human eye is from the display device, the less obvious the moire pattern is. Designating the observation point by select the value of h within this range makes the calculation result closer to the actual situation.

In step S2412, the pixel pattern is divided into a plurality of second lower layer regions.

When the pixel pattern is divided into a plurality of second lower layer regions, it is only necessary to ensure that the areas of the respective second lower layer regions are equal, and there is no overlapping region therebetween.

When dividing, each of the first lower layer regions is divided into an integer number of second lower layer regions having the same shape and area.

Optionally, the second lower layer region may be rectangular or square. A side length of the square can be 1 to 2.5 μm. When the pixel pattern is divided into the second lower layer regions, it is ensured that the first lower layer region of the first region may be divided into an integer number of second lower layer regions.

In step S2413, a region defined by the oblique projection points, on the touch pattern, of the edge points of the second lower layer region is taken as the corresponding second upper layer projection region.

Herein, a edge point, the oblique projection point of the edge point on the touch pattern and the observation point satisfy the following relationship:

a light emitted from a point light source disposed at the edge point and passing through the oblique projection point of the edge point on the touch pattern can pass through the observation point after passing through the touch pattern.

Figure 14:
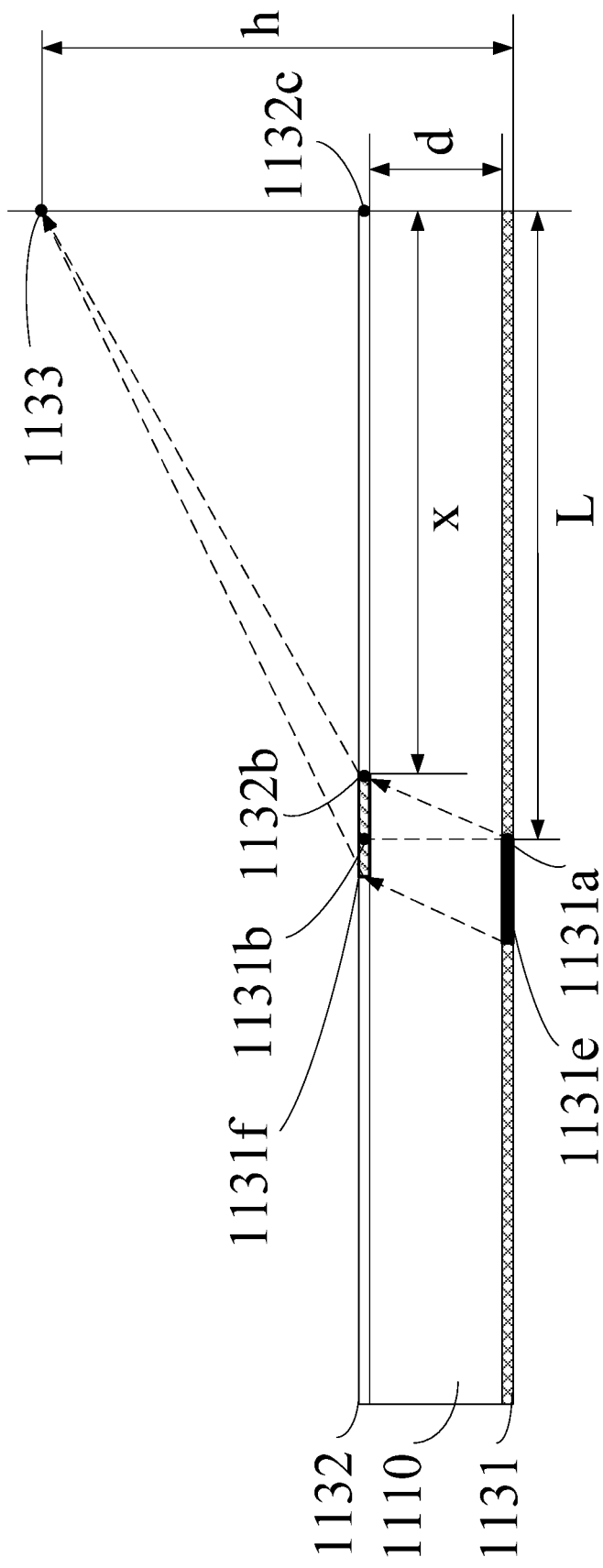
FIG. 14 is a sectional view of part of a superimposed pattern according to an embodiment of the present disclosure.

In the superimposed pattern shown in FIG. 14, the second lower layer region 1131e and the second upper layer projection region 1131f are included in the same second region. An orthographic projection, on the touch pattern, of a point 1131a on the second lower layer region 1131e is a point 1131b. An oblique projection, on the touch pattern, of the point 1131a is 1132b.

Since the color film substrate is with a certain thickness, if the line of sight is not perpendicular to the color film substrate when observing a display screen, the lights passing through the pixel pattern will be refracted within the color film substrate (as shown by dotted lines with arrows in FIG. 14). Therefore, the lights do not pass through the pixel pattern and the touch pattern vertically. There is a slight "misalignment" between the second lower layer region and the second upper layer projection region in the same second region in a direction parallel to the pixel pattern. In consideration of the refraction effect generated by the color film substrate, the correspondence between the points on the pixel pattern and the points on the touch pattern may be established to improve the design precision.

In the superimposed pattern, the distance L between the edge point and the reference point, and the distance x between the oblique projection point, on the touch pattern, of the edge point and the reference point satisfy the following equation:

$$L = \frac{d \cdot x}{\sqrt{(n^2-1)x^2 + n^2(h-d)^2}} + x \qquad (4)$$

Herein, d is a thickness of the color film substrate, n is a refractive index of the color film substrate, and h is a distance between the observation point and the pixel pattern, wherein h>d.

Figure 15:
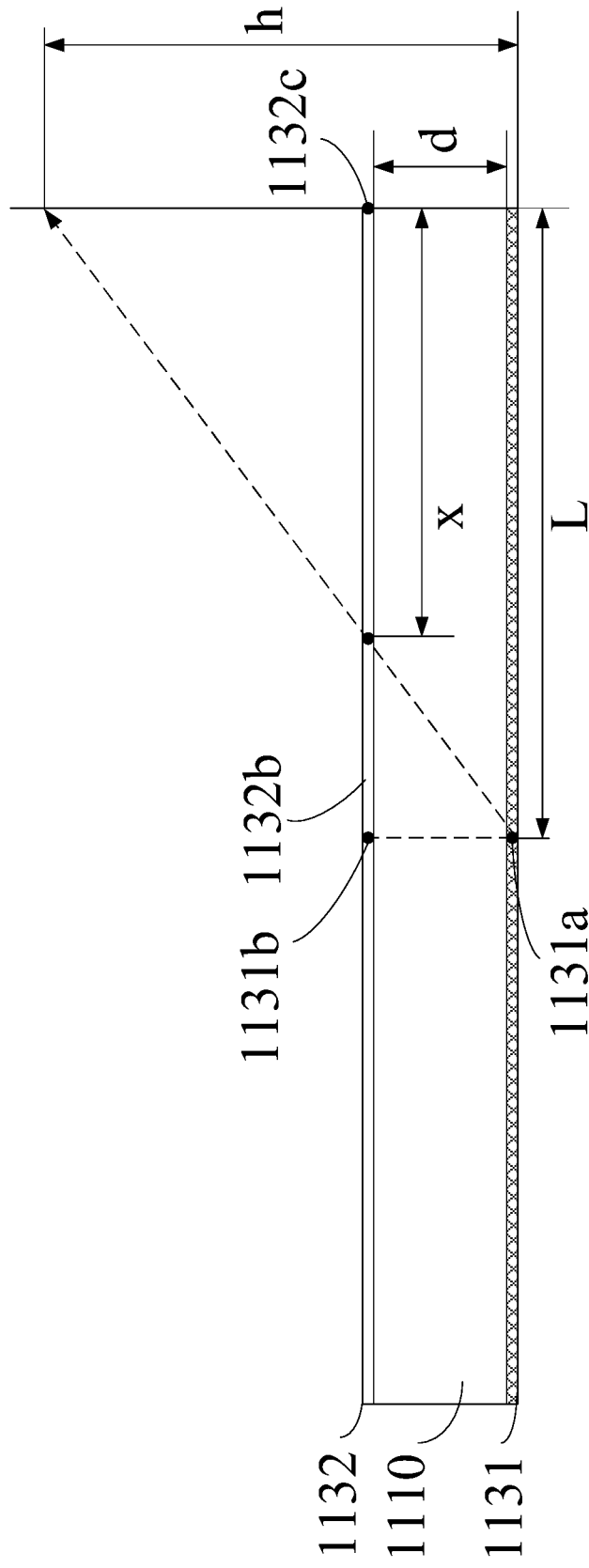
FIG. 15 is a sectional view of part of a superimposed pattern according to an embodiment of the present disclosure.

In addition, when determining the second upper layer projection region and the second lower layer region by using this method, the refractive index of the color film substrate may also be approximated. That is, the refractive index of the color film substrate is taken as n=1. The refractive index of the color film substrate is the same as the refractive index of air. A corresponding optical path diagram is as shown in FIG. 15. The formula (4) in this case is simplified to:

$$L = \frac{d \cdot x}{h - d} + x, \qquad (5)$$

which is advantageous to improve the processing efficiency.

In step S25, a variance is calculated based on the equivalent grayscale values of the plurality of first regions of the superimposed pattern.

Exemplarily, the variance may be calculated according to the following formula:

$$S = [(N_1-N_0)^2 + (N_2-N_0)^2 + (N_3-N_0)^2 + \ldots + (N_n-N_0)^2]/n \qquad (6)$$

wherein, the variance S of the equivalent grayscale values of the n first regions of the superimposed pattern is calculated. Herein, $N_1, N_2, N_3, \ldots, N_n$ are the equivalent grayscale values of the n first regions respectively, and $N_0$ is an average value of the equivalent grayscale values of the n first regions.

In step S26, a touch pattern is selected as a touch layer pattern from the touch patterns whose variances are less than a set value.

The magnitude of the variance may reflect the dispersion degree of the equivalent grayscale values of the plurality of first regions. The smaller the variance value is, the closer the equivalent grayscale values of the plurality of first regions are, and the less obvious the formed moire pattern is. In the course of selection, a touch pattern whose variance is less than a set value may be selected as a touch layer pattern. Exemplarily, the set value may be set in advance. Alternatively, the respectively calculated variances of the plurality of touch patterns may be sorted, one of which is taken as the set value, and then a touch pattern is selected as the touch layer pattern from the touch patterns whose variances are less than the set value. In the course of selection, if the process difficulty and cost are not considered, the touch pattern with the smallest variance may be selected from the touch patterns whose variances are less than the set value.

After the touch layer pattern is determined, the touch layer may be manufactured according to the pattern.

Figure 16:
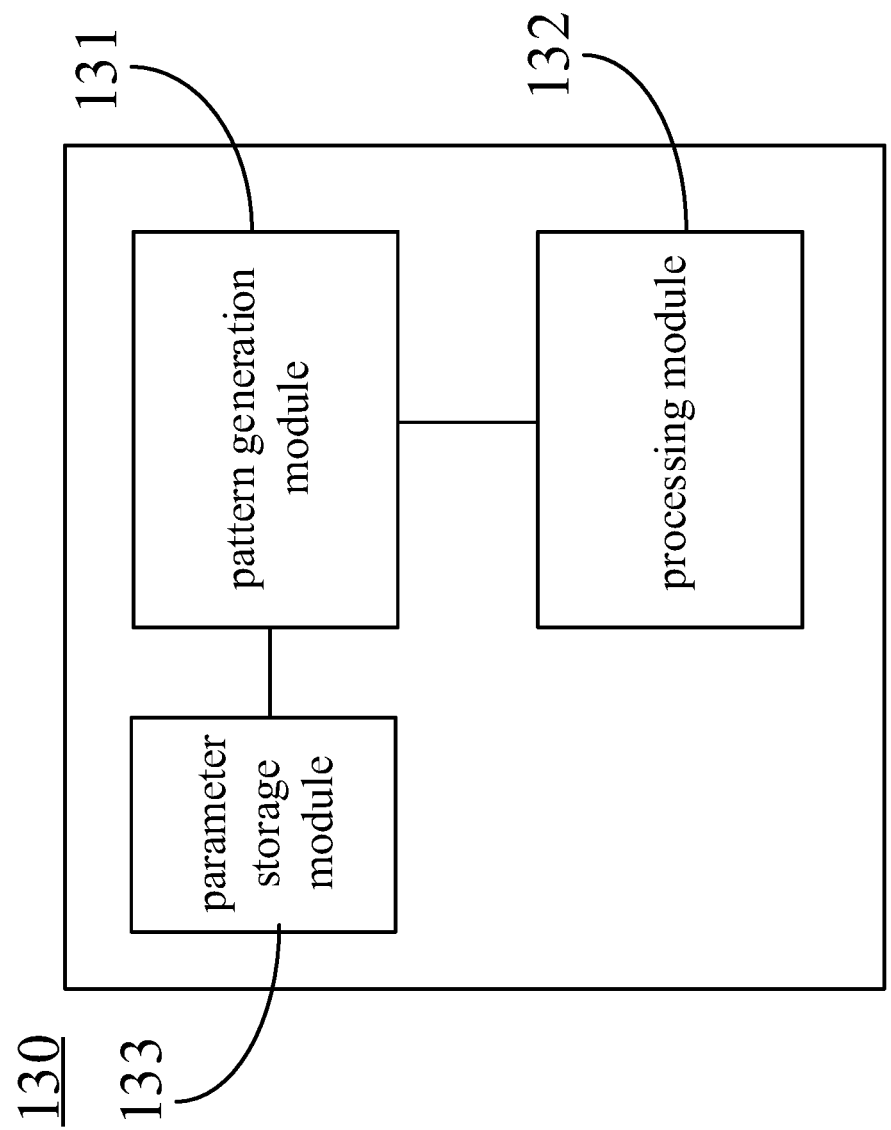
FIG. 16 is schematic diagram of a structure of device for a touch layer pattern according to an embodiment of the present disclosure.

FIG. 16 is schematic diagram of a structure of a determination device for a touch layer pattern according to an embodiment of the present disclosure. The determination device 130 is configured to determine the touch layer by using the method shown in FIGS. 1 and 2. As shown in FIG. 16, the determination device 130 comprises a pattern generation module 131 and a processing module 132. Herein, the pattern generation module 131 is configured to provide a pixel pattern and superimpose at least two different touch patterns with the pixel pattern respectively to obtain at least two superimposed patterns, the pixel pattern comprising a light shielding region and a sub-pixel region defined by the light shielding region. The processing module 132 is configured to determine, according to equivalent grayscales of the at least two superimposed patterns, one touch pattern as a touch layer pattern from the at least two touch patterns.

At least two touch patterns are superimposed with the pixel pattern respectively to obtain the superimposed patterns, and then one touch pattern is determined as a touch layer pattern from the at least two touch patterns according to equivalent grayscales of the superimposed patterns. Since the equivalent grayscales of the superimposed patterns can reflect the obvious degree of the moire patterns formed during the lights passing through the color film substrate and the touch layer which is arranged on the color film substrate having the pixel pattern, the touch layer pattern with less obvious moire pattern may be determined, which is beneficial to reduce the influence of the moire pattern on the display effect of the touch display device.

The touch pattern may be generated according to touch pattern parameters. Exemplarily, the generation manner may be seen in step S21 of the aforementioned method embodiment, which will not be described in detail herein.

Optionally, the determination device 130 may further comprise a parameter storage module 133 which is configured to store a plurality of different touch pattern parameters. The parameter storage module 133 may provide a plurality of stored different touch pattern parameters to the pattern generation module 131. The pattern generation module 131 may generate a plurality of different touch patterns according to the touch pattern parameters.

Figure 17:
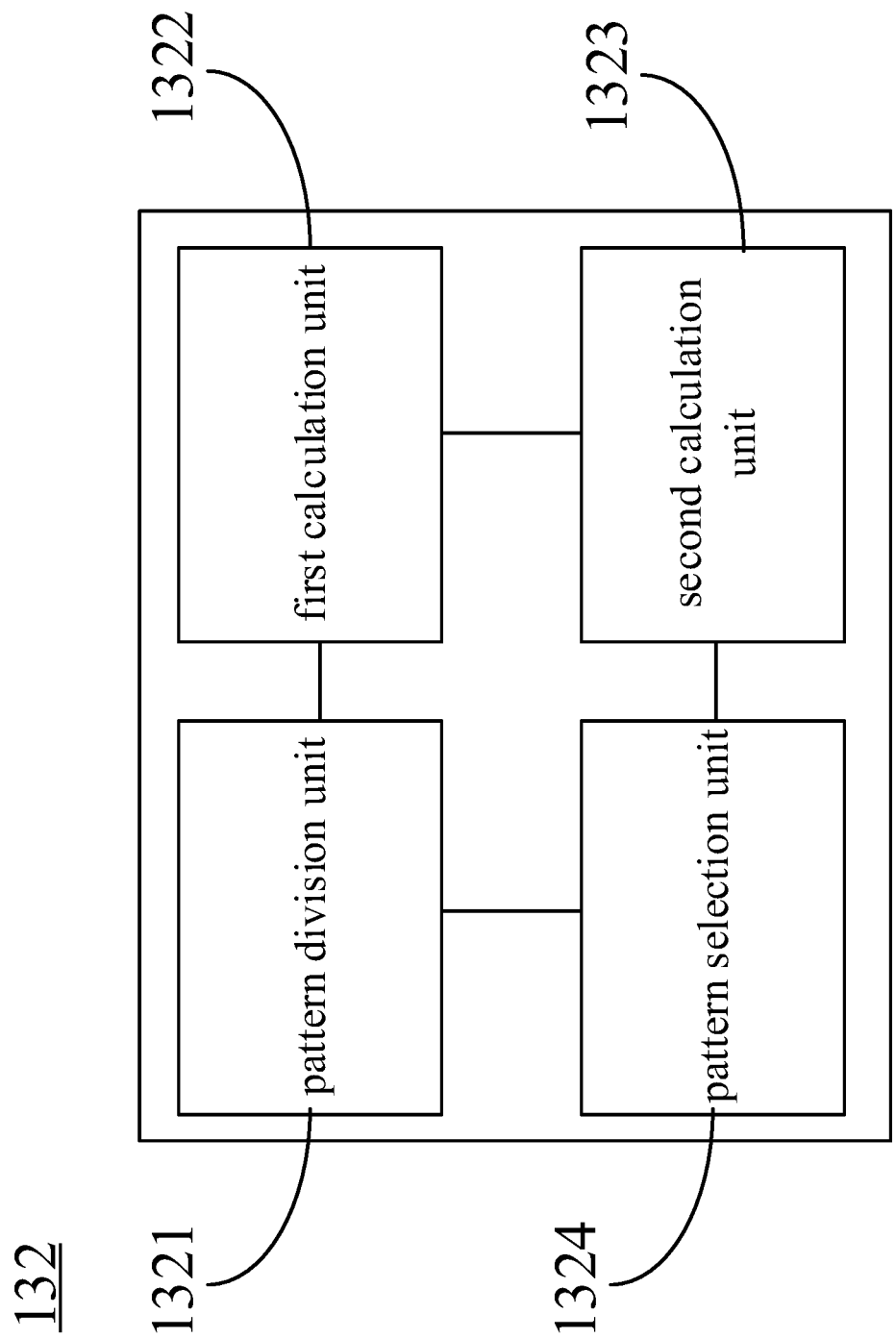
FIG. 17 is schematic diagram of a structure of a processing module according to an embodiment of the present disclosure.

FIG. 17 is schematic diagram of a structure of a processing module according to an embodiment of the present disclosure. As shown in FIG. 17, the processing module 132 may comprise a pattern division unit 1321, a first calculation unit 1322, a second calculation unit 1323, and a pattern selection unit 1324.

The pattern division unit 1321 is configured to divide the superimposed pattern into a plurality of first regions. Taken the same areas of the superimposed patterns, the more the number of the divided first regions is, the more accurately a better touch pattern can be determined. The more the number of the first regions is, the more cumbersome and inefficient the processing procedure is. In actual processing, the superimposed pattern can be divided into a proper number of first regions by considering the accuracy of the results and the production efficiency comprehensively. Exemplarily, the division process may refer to step S22 of the aforementioned method embodiment.

The first calculation unit 1322 is configured to calculate equivalent grayscale values of the first regions, respectively. The process during which the first calculation unit 1322 calculates the equivalent grayscale values of the first regions may refer to step S23 of the aforementioned method embodiment.

In order to calculate the equivalent grayscale values of the first regions more accurately and being advantageous to determine the touch pattern more accurately, when the first region is further divided into a plurality of second regions for the calculation of the equivalent grayscale values as aforementioned, the pattern division unit 1321 may be further configured to divide each of the first regions into a plurality of second regions, and the first calculation unit 1322 is further configured to calculate the equivalent grayscale values of the respective second regions, and for each first region to take an average value of the equivalent grayscale values of all the second regions in the first region as an equivalent grayscale value of the first region. The process during which the first calculation unit 1322 calculates the equivalent grayscale values of the second regions may refer to the aforementioned method embodiment, which is not described in detail herein.

The second calculation unit 1323 may be configured to calculate a variance according to the equivalent grayscale values of the plurality of first regions of the superimposed pattern. The variance S of the equivalent grayscale values of the n first regions of the superimposed pattern may be calculated according to the formula (6).

Optionally, the first calculation unit 1322 and the second calculation unit 1323 may be of the same structure.

The pattern selection unit 1324 may be configured to select a touch pattern whose variance is less than a set value as a touch layer pattern. The magnitude of the variance may reflect the dispersion degree of the equivalent grayscale values of the plurality of first regions. The smaller the variance value is, the closer the equivalent grayscale values of the plurality of first regions are, and the less obvious the formed moire pattern is. In the course of selection, a touch pattern whose variance is less than a set value may be selected as a touch layer pattern. Exemplarily, the set value may be set in advance. Alternatively, the respectively calculated variances of the plurality of touch patterns may be sorted, one of which is taken as the set value, and then a touch pattern is selected as the touch layer pattern from the touch patterns whose variances are less than the set value. In the course of selection, if the process difficulty and cost are not considered, the touch pattern with the smallest variance may be selected from the touch patterns whose variances are less than the set value.

When dividing the second regions, each of the second regions includes a second lower layer region located on the pixel pattern and a second upper layer projection region located on the touch pattern. An orthographic projection, on the touch pattern, of the second lower layer region may coincide with the second upper layer projection region to simplify the processing procedure and improve the efficiency. Alternatively, a region defined by the oblique projection points, on the touch pattern, of the edge points of the second lower layer region may be used as the corresponding second upper layer projection region to improve the design precision. Exemplarily, it may refer to the aforementioned method embodiments.

A touch display device is further provided by an embodiment of the present disclosure. The touch display device comprises a touch layer. In the touch layer, a touch layer pattern is determined using the aforementioned method. The touch display device includes, but is not limited to, a smart phone, a MID (Mobile Internet Device), a tablet computer, a navigator, a vehicle-mounted computer, or a digital camera.

Figure 18:
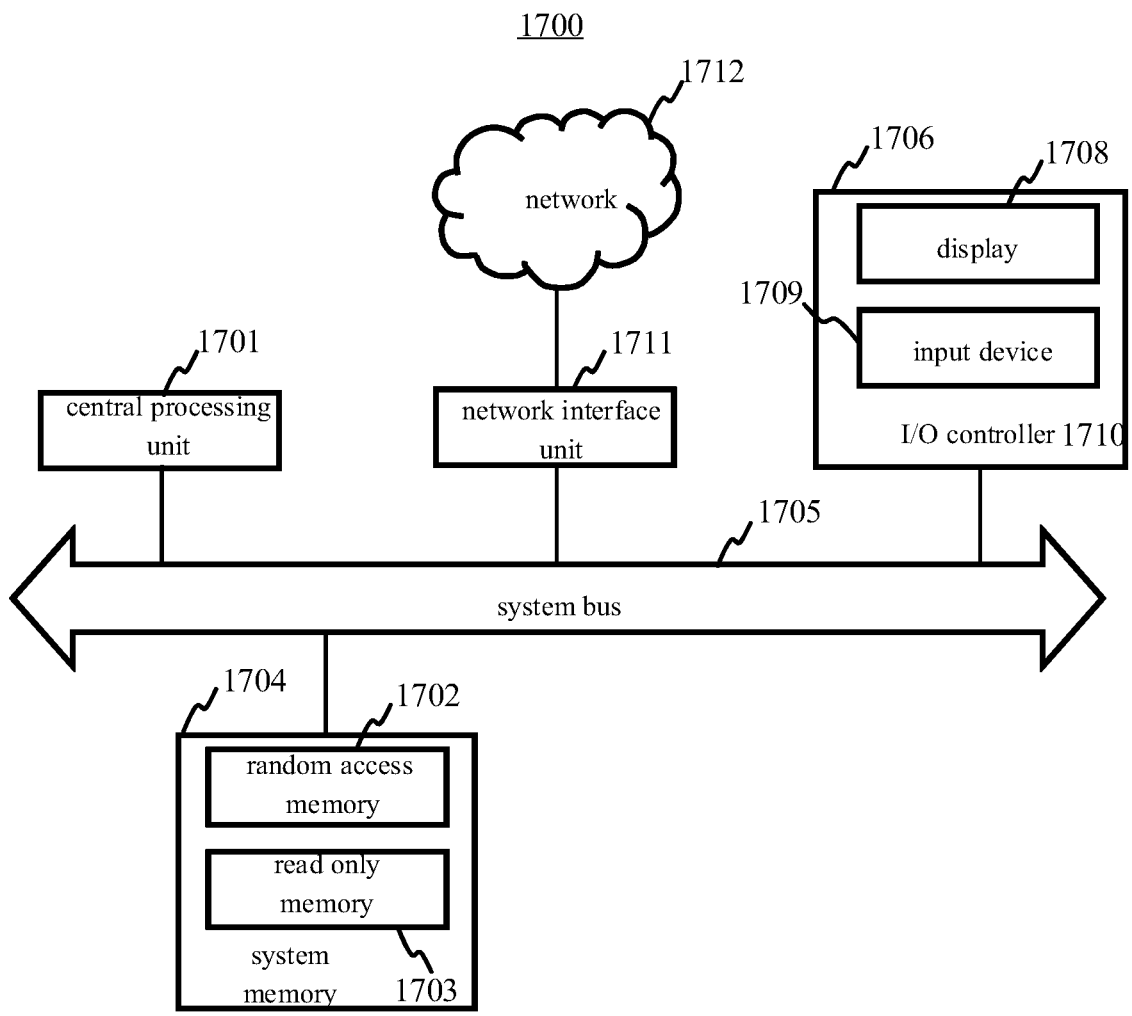
FIG. 18 is schematic diagram of a structure of a device for determining a touch layer pattern according to an embodiment of the present disclosure.

FIG. 18 is a schematic diagram of a structure of a device for determining a touch layer pattern provided by an embodiment of the present disclosure. The determination device may be a device such as a computer, etc.

As shown in FIG. 18, exemplarily, a computer 1700 comprises a central processing unit (CPU) 1701, a system memory 1704 including a random access memory (RAM) 1702 and a read only memory (ROM) 1703, and a system bus 1705 that connects the system memory 1704 and the central processing unit 1701. The computer 1700 further comprises a basic input/output system (I/O system) 1706 that facilitates transmitting information among the components within the computer.

The basic I/O system 1706 includes a display 1708 for displaying information and an input device 1709, such as a mouse or a keyboard, for users to input information. Both the display 1708 and the input device 1709 are connected to the central processing unit 1701 via an I/O controller 1710 that is connected to the system bus 1705. The basic I/O system 1706 may further include the I/O controller 1710 for receiving and processing the inputs from a plurality of other devices, such as a keyboard, a mouse, or an electronic stylus, etc. Similarly, the I/O controller 1710 further provides outputs to a display screen, a printer, or other type of output devices.

Without loss of generality, a computer readable medium may include a computer storage medium and a communication medium. The computer storage medium includes volatile and nonvolatile, mobile and immobile media implemented by any method or technology for storage of information such as computer readable instructions, data structures, program modules or other data. The computer storage medium includes a RAM, a ROM, an EPROM, an EEPROM, a flash memory or other solid state storage technologies, a CD-ROM, a DVD or other optical storage, a tape cartridge, a magnetic tape, a magnetic disk storage or other magnetic storage devices. Of course, those skilled in the art will appreciate that the computer storage medium is not limited to the above several devices.

According to various embodiments of the present disclosure, the computer 1700 may also be operated by a remote computer connected to a network via a network such as the Internet. That is, the computer 1700 may be connected to the network 1712 through a network interface unit 1711 connected to the system bus 1705. Alternatively, the network interface unit 1711 may be connected to other types of networks or remote computer systems (not shown).

The above memory also includes one or more programs, one or more programs being stored in the memory and configured to be executed by the CPU. When the CPU executes a program in the memory, the method shown in either of FIGS. 1 and 2 can be implemented.

In an exemplary embodiment, there is also provided a computer readable storage medium comprising instructions, such as a memory comprising instructions. The above instructions may be loaded and executed by the central processing unit 1701 of the computer 1700 to perform the method illustrated in either of FIGS. 1 and 2. For example, the computer readable storage medium may be a ROM, a RAM, a CD-ROM, a magnetic tape, a floppy disk, or an optical data storage device, etc.

The foregoing descriptions are only exemplary embodiments of the present disclosure, and are not intended to limit the present disclosure. Within the spirit and principles of the disclosure, any modifications, equivalent substitutions, improvements, etc., are within the protection scope of appended claims of the present disclosure.

What is claimed is:

1. A method for determining a touch layer pattern, comprising:
providing a pixel pattern including a light shielding region and a sub-pixel region defined by the light shielding region;
superimposing at least two different touch patterns with the pixel pattern respectively to obtain at least two superimposed patterns; and
determining a touch pattern as a touch layer pattern from the at least two touch patterns according to equivalent grayscales of the at least two superimposed patterns, and
wherein said determining a touch pattern as a touch layer pattern from the at least two touch patterns according to the equivalent grayscales of the at least two superimposed patterns comprises:
dividing the superimposed pattern into a plurality of first regions;
calculating an equivalent grayscale value of each of the first regions;
calculating a variance according to the equivalent grayscale value of each of the first regions; and
selecting a touch pattern as the touch layer pattern from the touch patterns whose variances are less than a set value; and
wherein each of the first regions comprises a first lower layer region located on the pixel pattern and a first upper layer projection region located on the touch pattern, said calculating an equivalent grayscale value of each of the first regions comprises:
setting the equivalent grayscale value of the first region as 0 when the first lower layer region of the first region is located in the light shielding region; and
calculating the equivalent grayscale value of the first region according to the following formula when the first lower layer region of the first region is located in the sub-pixel region, $$N=255*K_2,$$

where $K_2$ is a light transmittance of the touch pattern in the first upper layer projection region of the first region, and $0<K_2\leq 1$.

2. The method according to claim 1, wherein said selecting a touch pattern as the touch layer pattern from the touch patterns whose variances are less than a set value comprises:
selecting a touch pattern with the smallest variance as the touch layer pattern from the touch patterns whose variances are less than the set value.

3. The method according to claim 1, wherein said calculating an equivalent grayscale value of each of the first regions comprises:
dividing each of the first regions into a plurality of second regions;
calculating an equivalent grayscale value of each of the second regions; and taking an average value of the equivalent grayscale values of all of the second regions in each of the first regions as an equivalent grayscale value of the first region.

4. The method according to claim 3, wherein each of the second regions comprises a second lower layer region located on the pixel pattern and a second upper layer projection region located on the touch pattern, and an orthographic projection, on the touch pattern, of the second lower layer region coincides with the second upper layer projection region.

5. The method according to claim 3, wherein each of the second regions comprises a second lower layer region located on the pixel pattern and a second upper layer projection region located on the touch pattern; said dividing each of the first regions into a plurality of second regions comprises:

designating a reference point on the touch pattern, and designating an observation point on a straight line perpendicular to the touch pattern with the reference point as a perpendicular foot, the touch pattern being located between the observation point and the pixel pattern;

dividing the pixel pattern into a plurality of second lower layer regions; and taking a region surrounded by oblique projection points, on the touch pattern, of the edge points of the second lower layer region as the corresponding second upper layer projection region, the edge point, the oblique projection point of the edge point on the touch pattern and the observation point satisfying the following relationship:

a light emitted from a point light source disposed at the edge point and passing through the oblique projection point, on the touch pattern, of the edge point can pass through the observation point after passing through the touch pattern.

6. The method according to claim 5, wherein a distance L between the edge point and the reference point, and a distance x between the oblique projection point, on the touch pattern, of the edge point and the reference point satisfy the following equation:

$$L = \frac{d \cdot x}{\sqrt{(n^2 - 1)x^2 + n^2(h-d)^2}} + x,$$

where d is a thickness of a color film substrate, n is a refractive index of the color film substrate, h is a distance between the observation point and the pixel pattern, and h>d.

7. The method according to claim 5, wherein said calculating the equivalent grayscale value of each of the second regions comprises:

setting the equivalent grayscale value of the second region as 0 when the second lower layer region of the second region is located in the light shielding region; and calculating the equivalent grayscale value of the second region according to the following formula when the second lower layer region of the second region is located in the sub-pixel region, $$N=255*K_3,$$

where $K_3$ is a light transmittance of the touch pattern in the second upper layer projection region, and $0<K_3\leq 1$.

8. A touch display device, comprising a touch layer of which a touch layer pattern is determined by using the determining method according to claim 1.

9. A non-transitory computer-readable storage medium on which at least one instruction is stored, wherein the instruction is loaded and performed by a processor to implement the operations performed in the method for determining a touch layer pattern according to claim 1.

10. A computer device, comprising a memory, a processor, and computer programs stored on the memory and executable on the processor, wherein the processor is configured to perform the following operations:

providing a pixel pattern including a light shielding region and a sub-pixel region defined by the light shielding region;

superimposing at least two different touch patterns with the pixel pattern respectively to obtain at least two superimposed patterns; and determining a touch pattern as a touch layer pattern from the at least two touch patterns according to equivalent grayscales of the at least two superimposed patterns; and wherein said determining a touch pattern as a touch layer pattern from the at least two touch patterns according to the equivalent grayscales of the at least two superimposed patterns comprises:

dividing the superimposed pattern into a plurality of first regions;

calculating an equivalent grayscale value of each of the first regions;

calculating a variance according to the equivalent grayscale value of each of the first regions; and selecting a touch pattern as the touch layer pattern from the touch patterns whose variances are less than a set value; and wherein each of the first regions comprises a first lower layer region located on the pixel pattern and a first upper layer projection region located on the touch pattern, said calculating an equivalent grayscale value of each of the first regions comprises:

setting the equivalent grayscale value of the first region as 0 when the first lower layer region of the first region is located in the light shielding region; and calculating the equivalent grayscale value of the first region according to the following formula when the first lower layer region of the first region is located in the sub-pixel region, $$N=255*K_2,$$

where K2 is a light transmittance of the touch pattern in the first upper layer projection region of the first region, and $0<K2\leq 1$.

11. The computer device according to claim 10, wherein said selecting a touch pattern as the touch layer pattern from the touch patterns whose variances are less than a set value comprises:

selecting a touch pattern with the smallest variance as the touch layer pattern from the touch patterns whose variances are less than the set value.

12. The computer device according to claim 10, wherein said calculating an equivalent grayscale value of each of the first regions comprises:

dividing each of the first regions into a plurality of second regions;

calculating an equivalent grayscale value of each of the second regions; and taking an average value of the equivalent grayscale values of all of the second regions in each of the first regions as an equivalent grayscale value of the first region.

13. The computer device according to claim 12, wherein each of the second regions comprises a second lower layer region located on the pixel pattern and a second upper layer projection region located on the touch pattern, and an orthographic projection, on the touch pattern, of the second lower layer region coincides with the second upper layer projection region.

14. The computer device according to claim 12, wherein each of the second regions comprises a second lower layer region located on the pixel pattern and a second upper layer projection region located on the touch pattern; said dividing each of the first regions into a plurality of second regions comprises:
- designating a reference point on the touch pattern, and designating an observation point on a straight line perpendicular to the touch pattern with the reference point as a perpendicular foot, the touch pattern being located between the observation point and the pixel pattern;
- dividing the pixel pattern into a plurality of second lower layer regions; and
- taking a region surrounded by oblique projection points, on the touch pattern, of an edge points of the second lower layer region as the corresponding second upper layer projection region, the edge point, the oblique projection point of the edge point on the touch pattern and the observation point satisfying the following relationship:
- a light emitted from a point light source disposed at the edge point and passing through the oblique projection point, on the touch pattern, of the edge point can pass through the observation point after passing through the touch pattern.

15. The computer device according to claim 14, wherein a distance L between the edge point and the reference point, and a distance x between the oblique projection point, on the touch pattern, of the edge point and the reference point satisfy the following equation:

$$L = \frac{d \cdot x}{\sqrt{(n^2 - 1)x^2 + n^2(h - d)^2}} + x,$$

where d is a thickness of the color film substrate, n is a refractive index of the color film substrate, h is a distance between the observation point and the pixel pattern, and h>d.

16. The computer device according to claim 14, wherein said calculating the equivalent grayscale value of each of the second regions comprises:
- setting the equivalent grayscale value of the second region as 0 when the second lower layer region of the second region is located in the light shielding region; and
- calculating the equivalent grayscale value of the second region according to the following formula when the second lower layer region of the second region is located in the sub-pixel region, $$N = 255 * K_3,$$

where $K_3$ is a light transmittance of the touch pattern in the second upper layer projection region, and $0 < K_3 \leq 1$.

* * * * *